United States Patent [19]

Iwase et al.

[11] Patent Number: 5,710,999
[45] Date of Patent: Jan. 20, 1998

[54] RADIO FREQUENCY APPARATUS

[75] Inventors: Akio Iwase; Shiro Yasue; Nobuyoshi Hizuka, all of Aichi Prefecture; Kohei Tanaka, Gifu Prefecture; Tomiyasu Chiba, Nagoya, all of Japan

[73] Assignee: Matsushita Electric Industrial Co., Ltd., Kadoma, Japan

[21] Appl. No.: 640,426

[22] Filed: Apr. 30, 1996

Related U.S. Application Data

[63] Continuation of Ser. No. 181,281, Jan. 13, 1994, abandoned.

[30] Foreign Application Priority Data

Jan. 29, 1993 [JP] Japan .......................... 5-014163

[51] Int. Cl.⁶ ..................................... H04B 1/06
[52] U.S. Cl. .................. 455/349; 455/176.1; 455/301; 455/338; 361/314; 361/316; 348/839
[58] Field of Search .......................... 455/344, 346, 455/347, 348, 349, 301, 338, 176.1, 188.2, 180.2, 312, 189.1, 191.1; 439/357, 358; 361/814, 816, 813; 348/839, 731

[56] References Cited

U.S. PATENT DOCUMENTS

| | | | |
|---|---|---|---|
| 4,325,103 | 4/1982 | Ito et al. | 361/816 |
| 4,661,998 | 4/1987 | Yamashita et al. | 455/349 |
| 4,689,825 | 8/1987 | Geiger et al. | 455/347 |
| 4,691,378 | 9/1987 | Kumamoto et al. | 455/301 |

FOREIGN PATENT DOCUMENTS

| | | | |
|---|---|---|---|
| 0149533 | 7/1985 | European Pat. Off. | |
| 2952648 | 1/1983 | Germany . | |
| 4264819 | 9/1992 | Japan | 455/349 |
| 1212184 | 11/1970 | United Kingdom . | |
| 1550736 | 8/1979 | United Kingdom . | |
| 1555257 | 11/1979 | United Kingdom . | |
| 2188503 | 9/1987 | United Kingdom . | |
| 2229876 | 10/1990 | United Kingdom . | |

OTHER PUBLICATIONS

Lewis, L., "Make This Plug–Together 8–Tube A.C. Receiver", Jan. 1939, pp. 400–401 and 431.

*Primary Examiner*—Reinhard J. Eisenzopf
*Assistant Examiner*—Doris To
*Attorney, Agent, or Firm*—Panitch Schwarze Jacobs & Nadel, P.C.

[57] ABSTRACT

A radio frequency apparatus has a tuner unit which is disposed in a tuner unit housing, and a demodulation unit which is disposed in a demodulation unit housing easily attached or removed to the tuner unit housing by a connecting device provided on side walls of the tuner unit housing and the demodulation unit housing.

29 Claims, 26 Drawing Sheets

RADIO FREQUENCY APPARATUS

This is a continuation of U.S. patent application Ser. No. 08/181,281, filed Jan. 13, 1994, now abandoned.

FIELD OF THE INVENTION AND RELATED ART STATEMENT

1. Field of the Invention

The present invention relates to a radio frequency apparatus which is for demodulating a signal which is received and tuned.

2. Description of the Related Art

A conventional radio frequency apparatus comprises a tuner unit and a demodulation unit which are disposed in a housing of which a side wall has plural terminals for inputting or outputting signals of the radio frequency apparatus.

Such conventional radio frequency apparatus that it has one housing receives the tuner unit and the demodulation unit, is disclosed in U.S. Pat. No. 4,689,825. In the conventional radio frequency apparatus, plural tuner unit must be prepared to deal with different frequency arrangements for each channel, or the different broadcast system for users of respective countries. And, plural demodulation unit must be prepared to deal with different demodulation systems, different operation systems for video signals and audio signals, and different requirements from users. Accordingly, various kinds of the radio frequency apparatus are prepared by combinations of plural kinds of the tuner units and plural kinds of the demodulation units in order to meet these requirements.

OBJECT AND SUMMARY OF THE INVENTION

An object of the present invention is to provide a radio frequency apparatus which can deal with various kinds of the above-mentioned requirements by connecting a tuner unit and a demodulation unit, and can be easily handled for assembling because the tuner unit and the demodulation unit are integrally connected as one body.

In order to achieve the above-mentioned objects, the radio frequency apparatus of the present invention comprises:

a tuner unit which includes a tuner unit housing, a tuner input terminal for receiving a radio frequency signal, a mixer circuit which is connected for receiving a radio frequency signal of the tuner input terminal, an oscillation circuit which outputs a signal having a designated frequency based on a receiving channel to the mixer circuit, and a tuner output terminal for outputting an intermediate frequency signal of the mixer circuit, a demodulation unit which includes a demodulation unit housing, a demodulation input terminal for receiving the intermediate frequency signal of the tuner output terminal, a demodulation circuit which is connected to receive an intermediate frequency signal of the demodulation input terminal, and a demodulation output terminal for outputting a signal of the demodulation circuit, and connecting means for attaching or removing between a side wall of the tuner unit housing of the tuner unit and a side wall of the demodulation unit housing of the demodulation unit.

While the novel features of the invention are set forth particularly in the appended claims, the invention, both as to organization and content, will be better understood and appreciated, alone with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENTS

First Embodiment

Figure 1:
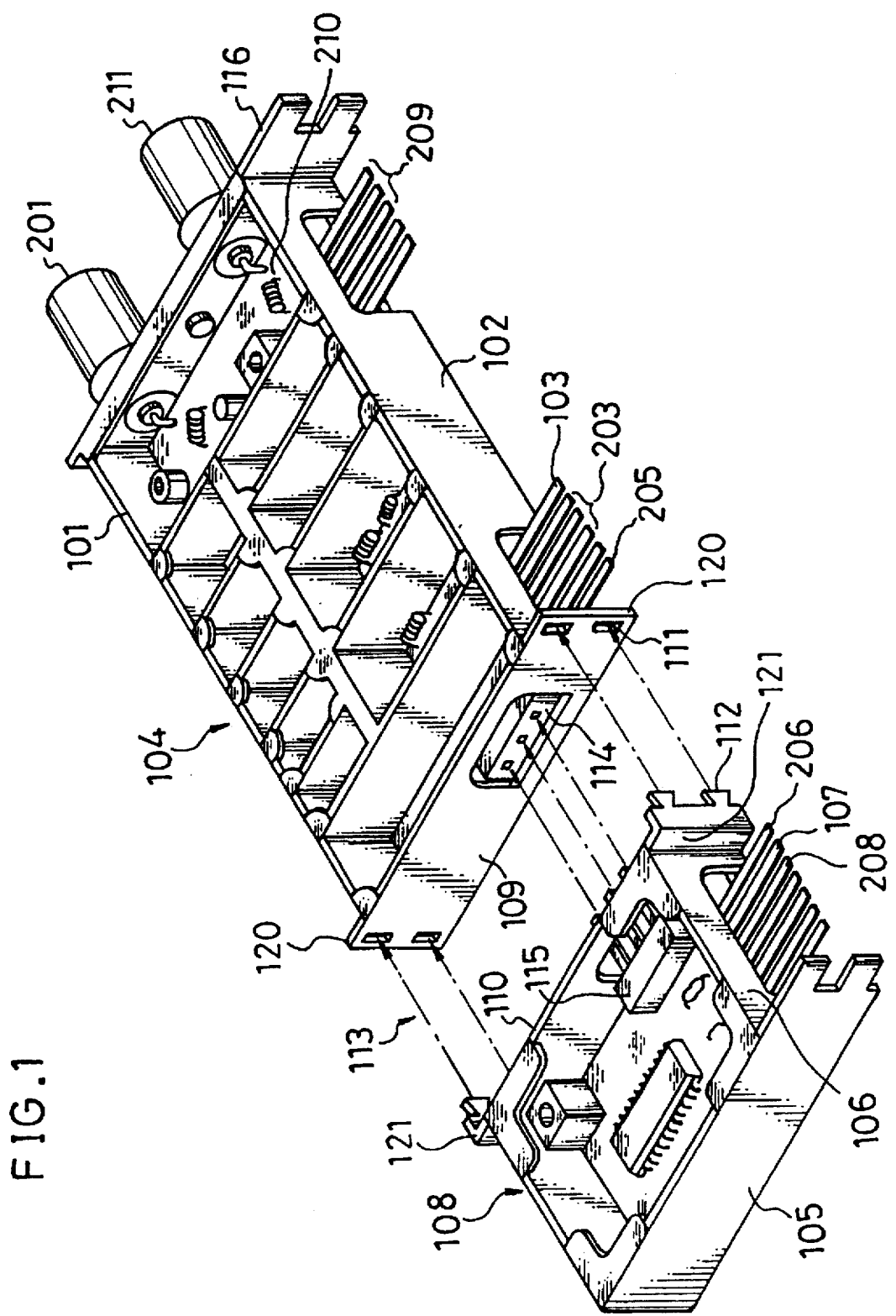
FIG. 1 is a perspective view of a radio frequency apparatus of a first embodiment in accordance with the present invention.
Figure 2:
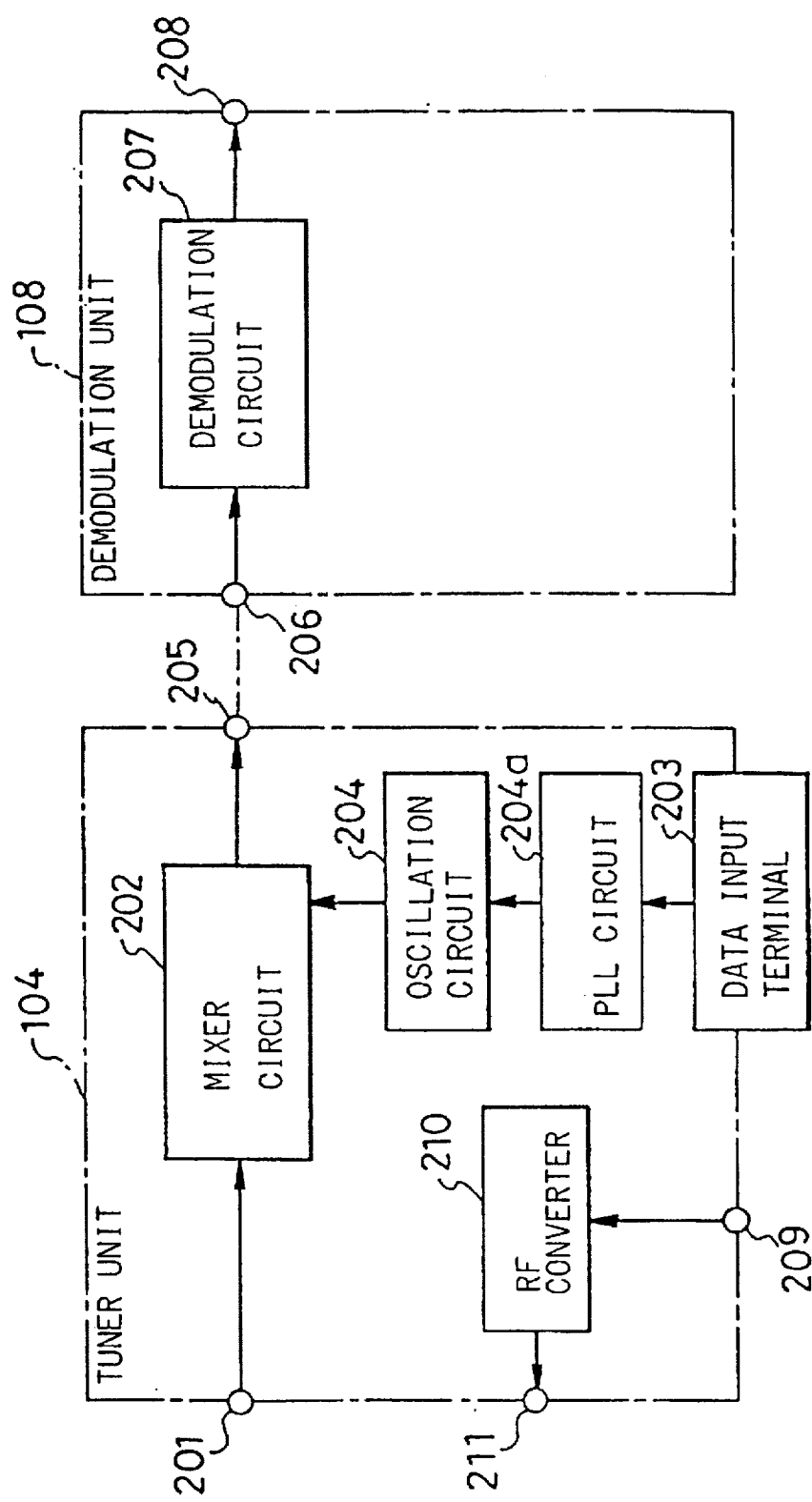
FIG. 2 is a block diagram of the radio frequency apparatus of FIG. 1.

Hereafter, a first embodiment of a radio frequency apparatus in accordance with the present invention is elucidated with reference to the accompanying drawings of FIGS. 1 and 2. FIG. 1 is a perspective view showing the radio frequency apparatus of the first embodiment, and FIG. 2 is a block diagram of the radio frequency apparatus of FIG. 1.

As shown in FIG. 1, the radio frequency apparatus of the first embodiment comprises a tuner unit 104 and a demodulation unit 108, which are disposed in separate metal housings, that is, a tuner unit housing 101 and a demodulation unit housing 108. In the tuner unit 104, a power source terminal 108, data input terminals 203 and a tuner output terminal 205 are arranged projecting from a flank wall 102 of the tuner unit housing 101 to an outside direction. The demodulation unit 108 has a power source terminal 107, an IF input terminal 206 and a demodulation signal output terminal 208 which are arranged to project from a flank wall 106 of the demodulation unit housing 105 to an outside direction as shown in FIG. 1.

In FIG. 1, a facing wall 109 of the tuner unit 104 is constructed to be mechanically connected to an opposite facing wall 110 of the demodulation unit 108. Two extended portions 120, 120, of the tuner unit 104 are provided on both sides of the facing wall 109, and have two angular holes 111, 111, respectively.

On the other hand, the-demodulation unit 108 provides two extended portions 121, 121 on both sides of the facing wall 110, and two projections 112 to be connected to the angular holes 111 of the tuner unit 104 are provided on the two extended portions 121, 121, respectively. Since the tuner unit 104 and the demodulation unit have connecting device 113, that is, the angular holes 111 and the projections 112, the tuner unit 104 and the demodulation unit 108 can be easily attached or removed by the connecting device 113.

After the projections 112 are inserted to the angular holes 111, the projections 112 may be bent to be tightly fixed to the tuner unit 104. If desired, the bent projections 112 and the angular holes 111 may be connected by soldering in order to obtain further solidly connection between them.

FIG. 2 shows a block diagram of the tuner unit 104 and the demodulation unit 108. In FIG. 1 and FIG. 2, a RF (radio frequency) input terminal 201 for outputting radio frequency signal is arranged on a side wall 116 which is opposite to the facing wall 109. The RF input terminal 201 is electrically connected to a mixer circuit 202 disposed in the tuner unit housing 101. A data input terminal 203 of the tuner unit 104 is electrically connected to the mixer circuit 202 through a PLL circuit (Phase-locked loop circuit) 204a and an oscillation circuit 204. An output signal of the mixer circuit 202 is produced from the tuner output terminal 205 for an IF (intermediate frequency) signal. The PLL circuit 204a has a known quartz oscillator (not shown).

The demodulation unit 108 has a demodulation circuit 207 for demodulating a signal from the tuner output terminal 205 of the tuner unit 104 via a demodulation input terminal 206. And the demodulated signal is produced from a demodulation output terminal 208.

In the tuner unit 104, the IF (intermediate frequency) output signal is produced from the tuner output terminals 205, which are arranged on a flank wall 102 projecting to an outside direction as shown in FIG. 1. And IF output signal is also arranged to be produced from a tuner connector 114 which is provided on the facing wall 109 to the demodulation unit 108. And, in the demodulation unit 108, the IF output signal is applied to the demodulation circuit 207 via the demodulation input terminal 206, which is arranged on the flank wall 108, and a demodulation connector 115, which is arranged in the facing wall 110 of the demodulation unit 108. Therefore, when the tuner unit 104 is coupled with the demodulation unit 108, the intermediate frequency signal are applied to the demodulation circuit 207 of the demodulation unit 206 because of connection between through the tuner connector 114 and the demodulation connector 115.

As mentioned above, the tuner output signal can be produced from both terminals, that is, the tuner output terminal 205 arranged in the flank wall 102 and the tuner connector 114 arranged in the facing wall 109. And, the tuner output signal of the tuner unit 104 can be received by both terminals of the demodulation unit 108, that is, the demodulation input terminal 206 arranged in the flank wall 108 and the demodulation connector 115 arranged in the facing wall 110. As a result, the tuner unit 104 and the demodulation unit 108 can be used integrally by connecting therebetween, as well as independently by separating.

In the tuner unit 104, video signal input terminals 209 provided on the flank wall 102 are connected to a RF (radio frequency) convertor 210, and the output signal of the RF convertor 210 is produced from an output terminal 211, as shown in FIG. 2.

Apart from the above-mentioned embodiment wherein the power source is applied to the power source terminals 103 and 107, which are provided on flank walls 102, 106, respectively, a modified embodiment may be configured such that the power source is applied to either terminal 103 or 107 of the tuner unit 104 or the demodulation unit 108. In this modified embodiment, the power source is fed through tuner connector 114 and the demodulation connector to the tuner unit 104 and the demodulation unit 108, 115.

Next, the operations of the radio frequency apparatus configured as above in accordance with the present invention is elucidated with reference to the drawing of FIG. 2. The radio frequency signals received by an antenna etc. are applied to the mixer circuit 202 of the tuner unit 104 via the radio frequency input terminals 201. And, the data signal received by the data input terminals 203 is applied to the PLL circuit 204a. Then, the oscillation circuit 204, which is connected to the PLL circuit 204a, produces a signal having a frequency corresponding to a receiving channel of the television receiver. The signal from the oscillation circuit 204 is applied to the mixer circuit 202 for mixing with the radio frequency signal. And the IF (intermediate frequency) signal is produced from the tuner output terminal 205, that is, a tuning operation have been conducted in the tuner unit 104. The output signal from the tuner unit 104 is applied to the demodulation circuit 207 via the demodulation input terminals 206. And the signal demodulated in the demodulation circuit 207 is output from the output terminals 208 of the demodulation unit 108.

In the tuner unit 104, the video signal from the video signal input terminals 209 of the tuner unit 104 is applied to the RF converter 210 for converting to the radio frequency signal. The converted radio frequency signal is output from the RF output terminal 211 of the tuner unit 104.

In Japan, a radio frequency apparatus in a television receiver (TV set) has two kinds of tuner units 104 which can correspond to two kinds of broadcasting frequencies.

(1) The first kind is for a standard television broadcasting service.

(2) The other kind is for a cable television service (CATV) having the standard television broadcasting frequency and a cable television broadcasting frequency. These tuner units 104 are set at a video signal intermediate frequency of 58.75 MHz, and at audio signal intermediate frequency of 54.25 MHz. And, some of the demodulation units 108 are prepared for satisfying the requests of the assemble shop, such as to meet an intercarrier system, a split carrier system, a synchronous detection system, a pseudo-synchronous detection system, or various circuit systems based on a different tone of color.

Figure 3:
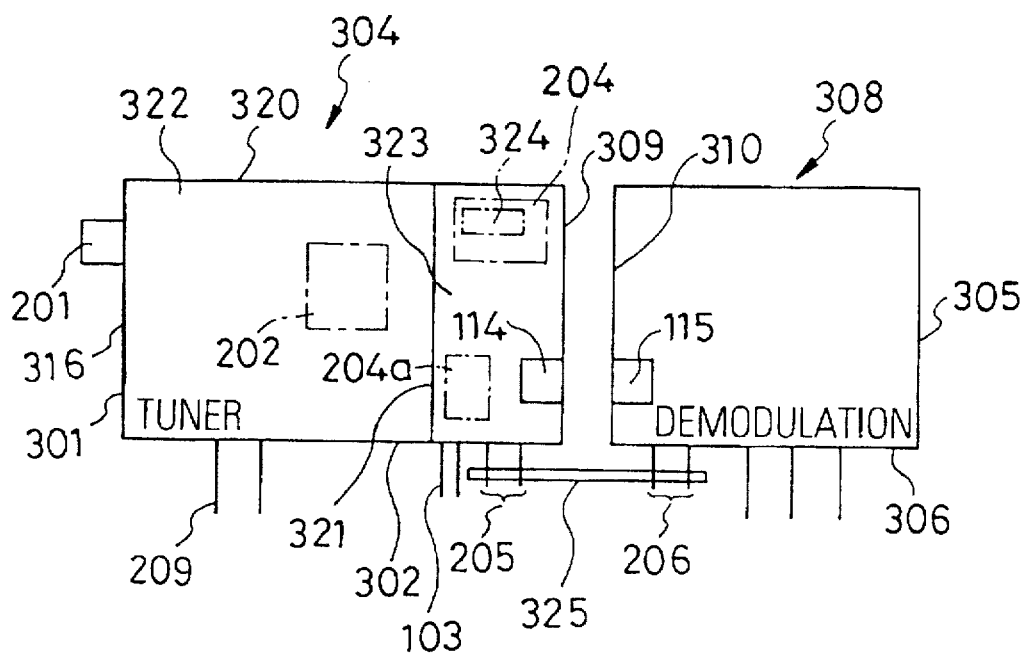
FIG. 3 is a schematic plan view of the radio frequency apparatus of FIG. 1.
Figure 4:
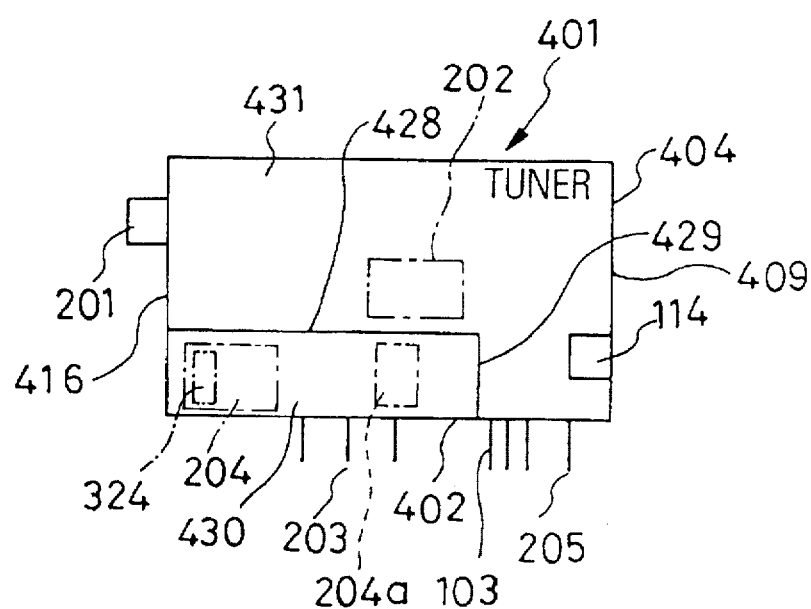
FIG. 4 is a schematic plan view of a tuner unit of a radio frequency apparatus in accordance with the present invention.

Next, the mounting arrangement of the above-mentioned circuits in the tuner unit housing and the demodulation unit housing is elucidated further referring to FIGS. 3 and 4. FIG. 3 is a schematic plan view of a radio frequency apparatus. FIG. 4 is a schematic plan view of a tuner unit. In FIGS. 3 and 4, corresponding component to the radio frequency apparatus shown in FIGS. 1 and 2 are designated by the same numerals.

In FIG. 3, a metal housing 301 of a tuner unit 304 measures approx. 85 mm(Length)×42 mm(Width)×14 mm(Height), and a metal separating plate 321 is disposed in the metal housing 301 to connect between both flank walls 302 and 320. Therefore, an inner area of the metal housing 301 of the tuner unit 304 is divided by the metal separating plate 321 in two rooms, namely, a first room 322 and a second room 323. A mixer circuit 202 of the tuner unit 304 is disposed in the first room 322, and a PLL circuit 204a and an oscillation circuit 204 having a quartz crystal 324 are disposed in the second room 323. The oscillation circuit 204 outputs a signal having designated frequency based on a receiving channel to the mixer circuit 202. The quartz crystal 324 is arranged in the second room 323 adjacent to a flank wall 320 which is opposite to the other flank wall 302 having plural terminals as shown in FIG. 3.

A RF input terminal 201 is provided on a front wall 316 which is opposite to a facing wall 309 having a tuner connector 114. An output signal, that is, an intermediate frequency signal, of the mixer circuit 202 is output from both terminals of the tuner connector 114 and the tuner output terminals 205 both of which are provided on the flank wall 302.

On the other hand, a demodulation unit 308 has a metal housing 305 which measures approx. 30 mm(Length)×42 mm(Width)×14 mm(Height). A demodulation connector 115 to be connected to the tuner connector 114 of the tuner unit 304 is arranged at a facing wall 310 adjacent to the flank wall 306 having plural terminals, as shown in FIG. 3.

In this embodiment, the quartz crystal 324 in the tuner unit housing 301 is arranged apart from the tuner connector 114 in the second room 323. Therefore, the oscillation signals of the quartz crystal 324 does not influence intermediate frequency signal of the tuner connector 114.

And, since the tuner connector 114 is arranged near the tuner output terminals 205, a conductive interconnection pattern on a printed board for connecting between the tuner connector 114 and the tuner output terminals 205 is constructed to have in short and simple form. As a result, the tuner unit 304 is realized to be formed in small size. And further, since the demodulation connector 115 of the demodulation unit 308 is arranged near the demodulation input terminals 206, the demodulation unit 308 is configured to have small size as the tuner unit 304.

Apart from the above-mentioned embodiment wherein the tuner unit 304 is connected to the demodulation unit 308 via the tuner connector 114 and the demodulation connector 115, a modified embodiment may be such that the tuner unit 304 and the demodulation unit 308 are electrically connected by a subsidiary substrate 325 which is arranged between the tuner output terminals 205 and the demodulation input terminals 206. In this modified embodiment, the tuner connector 114 and the demodulation connector 115 are not necessary in the radio frequency apparatus for electrically connecting between the tuner unit 304 and the demodulation unit 308.

And, apart from the above-mentioned embodiment wherein the tuner unit 304 and the demodulation unit 308 are disposed to be arranged in straight form as shown in FIG. 1, a modified embodiment may be such that the tuner unit and the demodulation unit are arranged to be formed in L-shape, or to be laminated by using a transformed connector or a subsidiary substrate which is formed in L-shape or U-shape, or by a wiring. As a result, the radio frequency apparatus having the above-mentioned tuner unit and demodulation unit can be disposed to adapt to various spaces in a television receiver etc.

FIG. 4 is a schematic plan view of a tuner unit 401 of a radio frequency apparatus showing another modification in accordance with the present invention. As shown in FIG. 4, two metal separating plates 428 and 429 are disposed in a tuner unit housing 404 to connect between a flank wall 402 and a front wall 416 having a RF input terminal 201. Therefore, an inner area of the tuner unit housing 404 is divided by the metal separating plates 428, 429 in two rooms, that is, a first room 430 and a second room 431. A PLL circuit 204a and an oscillation circuit 204 having a quartz crystal 324 are disposed in the first room 430. The quartz crystal 324 is arranged at a position adjacent to the front wall 416 as shown in FIG. 4. A mixer circuit 202 is disposed in the second room 431, and a tuner connector 114 is arranged on a facing wall 409.

Since the quartz crystal 324 is arranged apart from the tuner connector 114, the intermediate frequency signal of the tuner connector 114 is not influenced by the signal from the quartz crystal 324. Data input terminals 203 are arranged on the flank wall 402 adjacent to the first room 430 where the PLL circuit 204a is disposed, and apart from the second room 431 where the mixer circuit 202 etc. are disposed. Therefore, digital signal of the data input terminals 203 does not influence a signal of the mixer circuit 202 etc.

Apart from the above-mentioned embodiments wherein the tuner unit and the demodulation unit are electrically connected by the tuner connector 114 and the demodulation connector 115, a modified embodiment may be such that a tuner unit and a demodulation unit are electrically connected by a photo-coupler, such as a light emitting diode and a light receiving transistor. In this modified embodiment, the influence to the intermediate frequency signal of these connectors is more decreased because of a photo-connecting device.

And further a modified embodiment may be such that a tuner unit and a demodulation unit are electrically connected by a coaxial-cable connector. In this modified embodiment, the connector may be provided on a flank wall opposite to the flank wall having the power source terminal 103 etc.

Second Embodiment

Figure 5A:
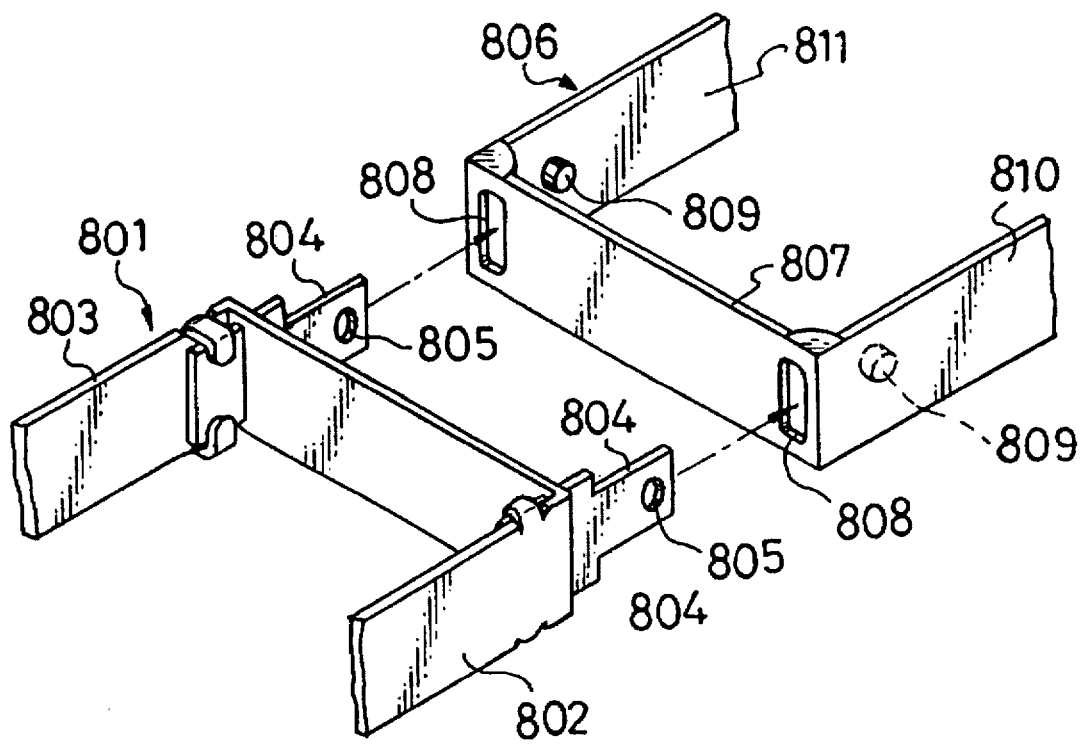
FIG. 5A is a perspective view showing a part of a radio frequency apparatus of a second embodiment in accordance with the present invention.
Figure 5B:
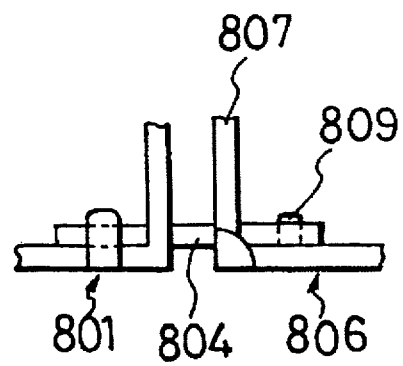
FIG. 5B is a plan view showing a part of the radio frequency apparatus of FIG. 5A.

Hereafter, a second embodiment of a radio frequency apparatus in accordance with the present invention is elucidated with reference to the accompanying drawings of FIGS. 5A and 5B. Corresponding parts and components to the first embodiment are shown by the same numerals and marks, and the description thereon made in the first embodiment similarly apply. Differences and features of this second embodiment from the first embodiment are as follows.

FIG. 5A is a perspective view showing a part of housings of the radio frequency apparatus of the second embodiment. FIG. 5B is a plan view showing a part of the housing of the radio frequency apparatus.

FIG. 5A shows a connecting means between a tuner unit 806 and a demodulation unit 801 of the radio frequency apparatus. As shown in FIG. 5A, two connector plates 804, 804 are attached to both flank walls 802, 803 of the demodulation unit 801, respectively. Each connector plate 804 has a hole 805 in a projection portion thereof.

On the other hand, a facing wall 807 of the tuner unit 806 has two holes 808, 808 adjacent to both flank walls 810, 811. Each flank wall 810, 811 has a projection 809 which is provided on an inside thereof. The projections 809 are arranged to be firmly connected to the holes 805 of the connector plates 804 through the holes 808 when the tuner unit 806 is coupled with the demodulation unit 801. As a result, the tuner unit 806 and the demodulation unit 801 can be integrally handled as one body.

When the tuner unit 806 or the demodulation unit 801 is used independently, the connector plates 804 can be removed from the demodulation unit 801.

Third Embodiment

Figure 6A:
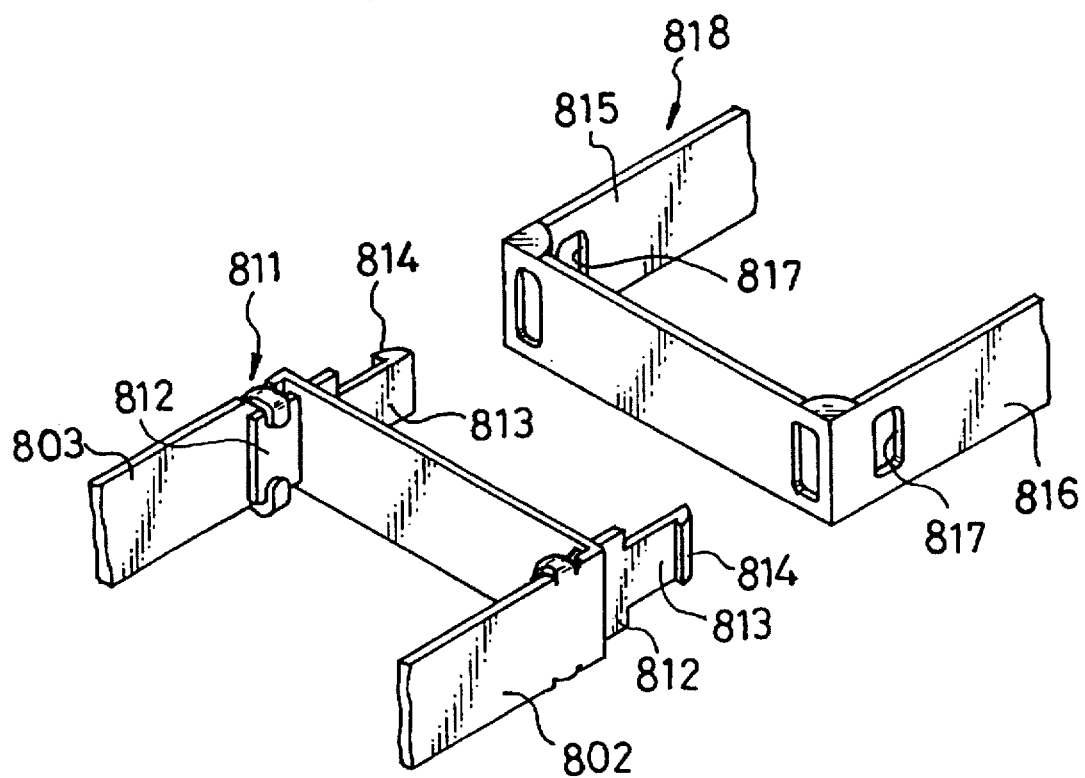
FIG. 6A is a perspective view showing a part of a radio frequency apparatus of a third embodiment in accordance with the present invention.
Figure 6B:
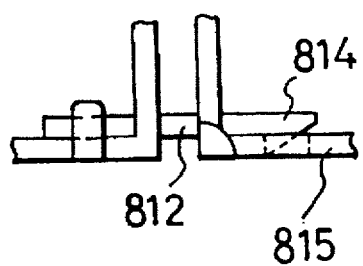
FIG. 6B is a plan view showing a part of the radio frequency apparatus of FIG. 6A.

FIG. 6A is a perspective view showing a part of housings of a radio frequency apparatus of a third embodiment in accordance with the present invention. FIG. 6B is a plan view showing a part of the housings of the radio frequency apparatus of FIG. 6A. Corresponding parts and components to the first embodiment are shown by the same numerals and marks, and the description thereon made in the first embodiment similarly apply. Differences and features of this third embodiment from the first embodiment are as follows.

FIG. 6A shows connecting device between a demodulation unit 811 and a tuner unit 818 of the radio frequency apparatus. As shown in FIG. 6A, two connector plates 812, 812, which are made of resin material, are attached to both flank walls 802, 803 of the demodulation unit 811, respectively. Each connector plate 812 has a hook 814 at the top end of a projection portion 813. These hooks 814 are provided to engage with holes 817 which are formed on flank walls 815, 816 of the tuner unit 818. Since the connector plates 812 are made of an elastic resin material, the tuner unit 818 and the demodulation unit 811 are easily attached or removed therebetween.

Fourth Embodiment

Figure 7A:
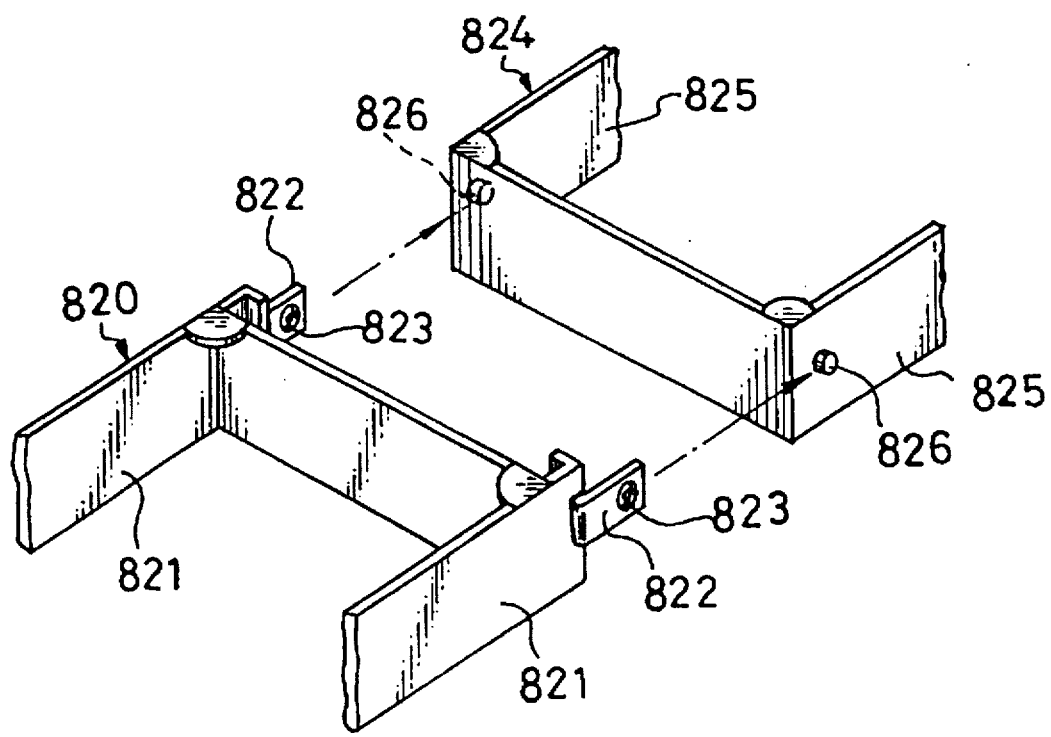
FIG. 7A is a perspective view showing a radio frequency apparatus of a fourth embodiment in accordance with the present invention.
Figure 7B:
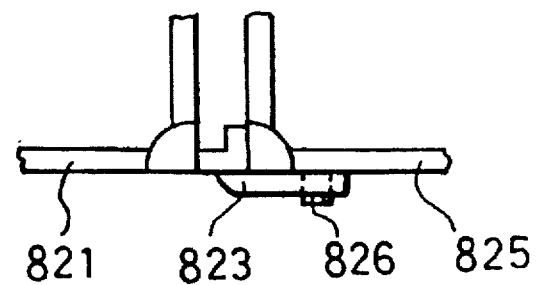
FIG. 7B is a plan view showing of the radio frequency apparatus of FIG. 7A.

FIG. 7A is a perspective view showing a part of housings of a radio frequency apparatus of a fourth embodiment in accordance with the present invention. FIG. 7B is a plan view showing a part of the housings of the radio frequency apparatus of FIG. 7A. Corresponding parts and components to the first embodiment are shown by the same numerals and marks, and the description thereon made in the first embodiment similarly apply. Differences and features of this fourth embodiment from the first embodiment are as follows.

FIG. 7A shows connecting device between a demodulation unit 820 and a tuner unit 824. As shown in FIG. 7A, both of flank walls 821, 821 have extended portions 822, 822, respectively. And the extended portion 822 has a hole 823 for engaging with a projection 826 on a flank wall 825 of the tuner unit 824 as shown in FIGS. 7A and 7B. The extended portion 822 is integrally formed with the flank wall 825 of the demodulation unit 820. As a result, the demodulation unit 820 and the tuner unit 824 are accurately and easily coupled therebetween. And, since the demodulation unit 820 and the tuner unit 824 are constructed only by few parts, the above-mentioned connecting device reduce the production cost of the radio frequency apparatus.

Fifth Embodiment

Figure 8A:
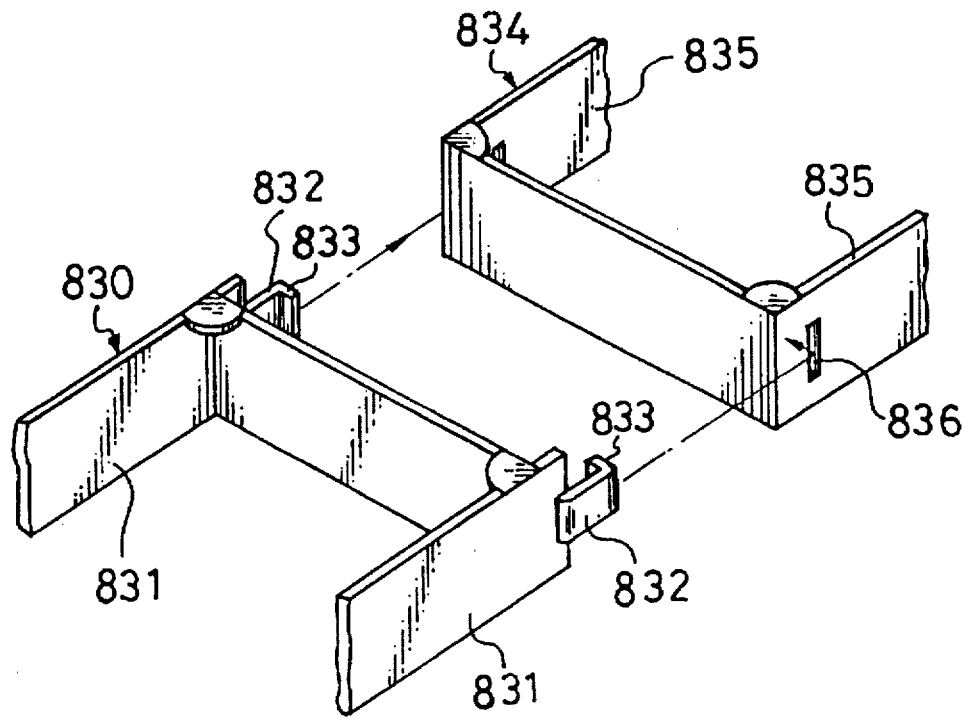
FIG. 8A is a perspective view showing of a radio frequency apparatus of a fifth embodiment in accordance with the present invention.
Figure 8B:
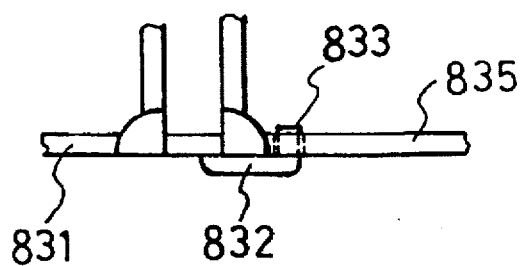
FIG. 8B is a plan view showing of the radio frequency apparatus of FIG. 8A.

FIG. 8A is a perspective view showing a part of housings of a radio frequency apparatus of a fifth embodiment in accordance with the present invention. FIG. 8B is a plan view showing a part of the housings of the radio frequency apparatus of FIG. 8A. Corresponding parts and components to the first embodiment are shown by the same numerals and marks, and the description thereon made in the first embodiment similarly apply. Differences and features of this fifth embodiment from the first embodiment are as follows.

FIG. 8A shows connecting device between a demodulation unit 830 and a tuner unit 834. As shown in FIG. 8A, both of flank walls 831, 831 have extended portions 832, 832, respectively. And the extended portion 832 has a hook 833 for engaging with a hole 836 of the tuner unit 834 as shown in FIGS. 8A and 8B. The extended portion 832 is integrally formed with the flank wall 831 of the demodulation unit 830. As a result, the demodulation unit 830 and the tuner unit 834 are accurately and easily coupled therebetween.

Sixth Embodiment

Figure 9A:
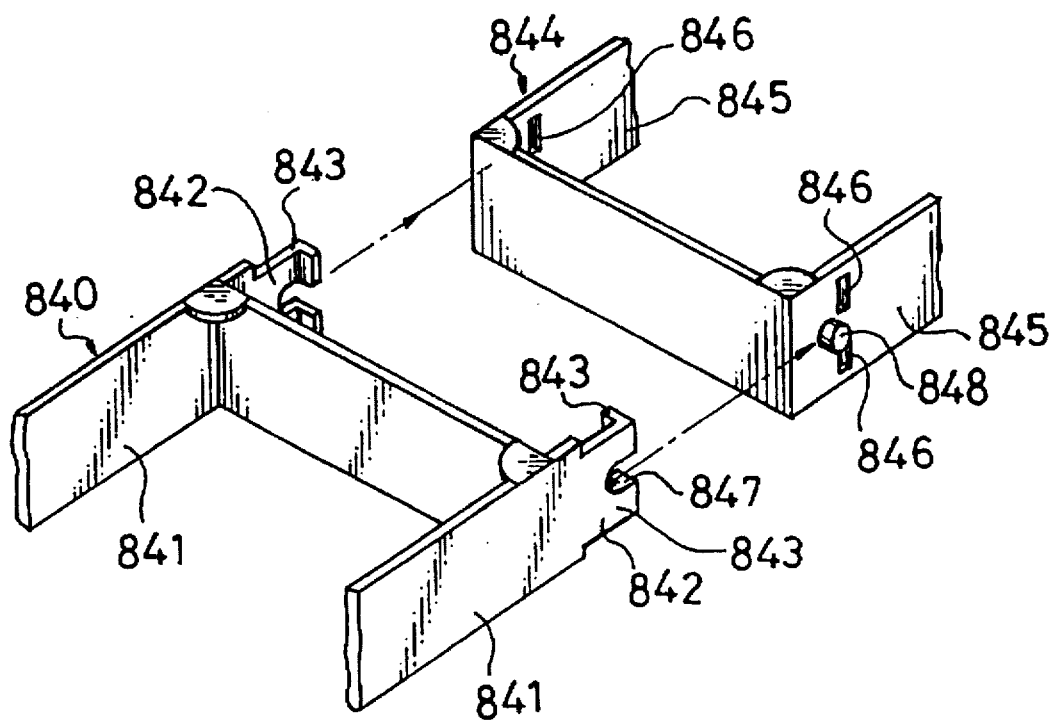
FIG. 9A is a perspective view showing of a radio frequency apparatus of a sixth embodiment in accordance with the present invention.
Figure 9B:
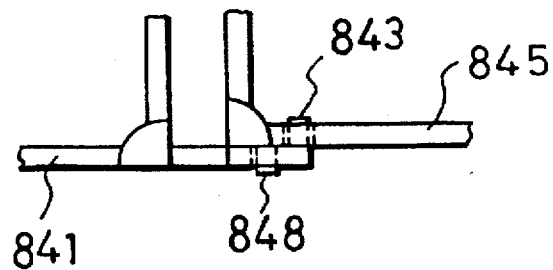
FIG. 9B is a plan view showing a part of the radio frequency apparatus of FIG. 9A.

FIG. 9A is a perspective view showing a part of housings of a radio frequency apparatus of a sixth embodiment in accordance with the present invention. FIG. 9B is a plan view showing a part of the housings of the radio frequency apparatus. Corresponding parts and components to the first embodiment are shown by the same numerals and marks, and the description thereon made in the first embodiment similarly apply. Differences and features of this sixth embodiment from the first embodiment are as follows.

FIG. 9A shows connecting device between a demodulation unit 840 and a tuner unit 844. As shown in FIG. 9A, both of flank walls 841, 841 have extended portions 842, 842, respectively. The extended portion 842 has two hooks 843, 843 which are engaged with two holes 846, 846 of the tuner unit 844, respectively. And further, a forked portion 847 between two hooks 843, 843 is arranged to be fitted to a projection 848 which is formed on the flank wall 845 of the tuner unit 844. The extended portion 842 is integrally formed with the flank wall 841 of the demodulation unit 840. Since the connecting device have two engaging systems, that is, the hook 843 and the hole 846, and the forked portion 847 and the projection 848, the demodulation unit 848 is surely and easily fitted to the tuner unit 847.

Seventh Embodiment

Figure 10A:
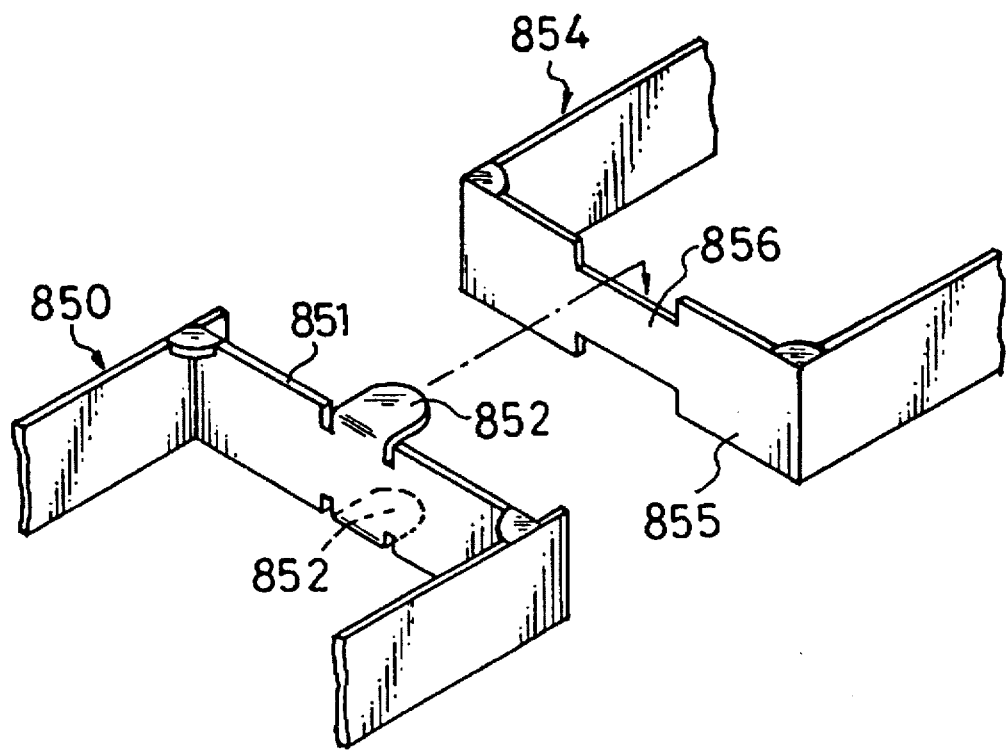
FIG. 10A is a perspective view showing a part of a radio frequency apparatus of a seventh embodiment in accordance with the present invention.
Figure 10B:
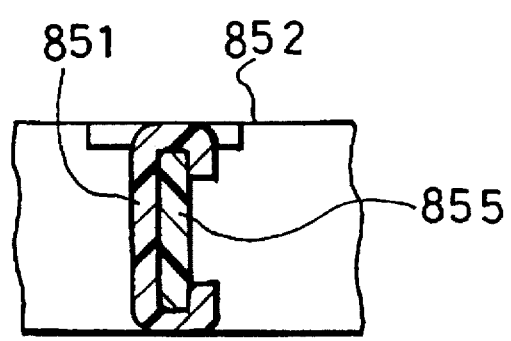
FIG. 10B is a sectional side view showing a part of the radio frequency apparatus of FIG. 10A.

FIG. 10A is a perspective view showing a part of housings of a radio frequency apparatus of a seventh embodiment in accordance with the present invention. FIG. 10B is a sectional view showing a part of the housing of the radio frequency apparatus of FIG. 10A. Corresponding parts and components to the first embodiment are shown by the same numerals and marks, and the description thereon made in the first embodiment similarly apply. Differences and features of this seventh embodiment from the first embodiment are as follows.

FIG. 10A shows connecting device between a demodulation unit 850 and a tuner unit 854. As shown in FIG. 10A, an facing wall 851 of the demodulation unit 850 has two bendable plates 852, 852 at an upper and lower of a middle portion thereof. The bendable plates 852, 852 are formed in tongue-shape as shown in FIG. 10A, respectively.

On the other hand, the tuner unit 854 has a facing wall 855 having a narrow portion 856 which is arranged so as to face to the bendable plates 852. The demodulation unit 850 and the tuner unit 854 are coupled by bending the bendable plates 852 as shown in FIG. 10B. The bendable plates 852 is tightly bent to catch the narrow portion 856 of the tuner unit 854. In this embodiment, since the facing wall 851 of the demodulation unit 850 is closely attached to the facing wall 855 of the tuner unit 854, a space for the connecting device is saved.

Eighth Embodiment

Hereafter, connectors of a radio frequency apparatus in accordance with the present invention is elucidated with reference to the accompanying drawings.

Figure 11:
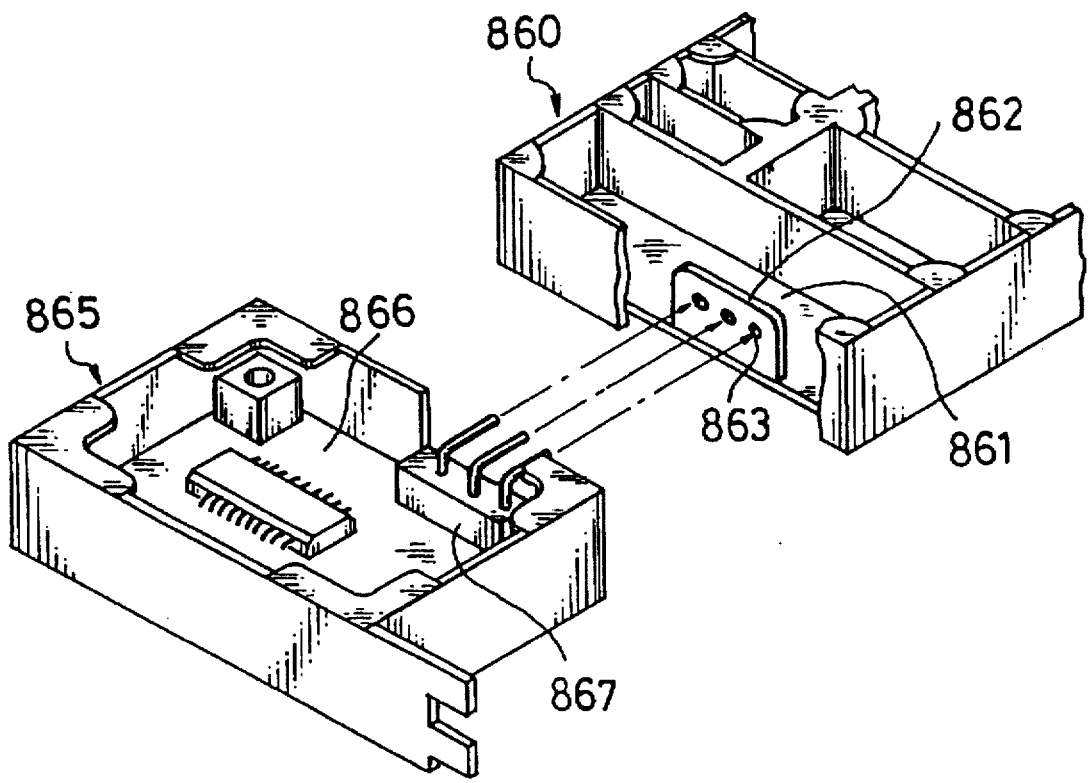
FIG. 11A is a sectional side view showing a part of a radio frequency apparatus of a seventh embodiment in accordance with the present invention.
FIG. 11B is a sectional side view showing a part of the radio frequency apparatus of FIG. 11A.
Figure 11:
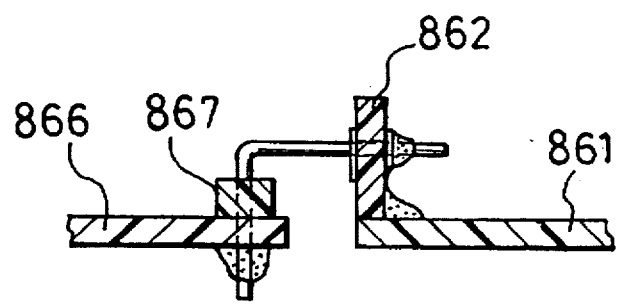

FIG. 11A is a perspective view showing a part of a demodulation unit 865 and a tuner unit 860 of an eighth embodiment of the radio frequency apparatus. FIG. 11B is a sectional view showing a part of the connectors of the radio frequency apparatus.

As shown in FIG. 11A, a subsidiary substrate 862 is mounted on a printed substrate 861 of the tuner unit 860. The subsidiary substrate 862 has plural holes 863 as a pin-type female terminal. The demodulation unit 865 has a printed substrate 866 on which a bent pin-type male terminal 867 is arranged to be connected to the pin-type female terminal of the tuner unit 860. The bent pin-type male terminal 867 is electrically connected to the subsidiary substrate 862 by inserting plural pins of the bend pin-type male terminal 867 into the plural holes 863 of the subsidiary substrate 861, and soldering the pins and holes 863 as shown in FIG. 11B. In this embodiment, the subsidiary substrate 862 used as a pin-type female terminal has a simple construction for electrically connecting between the demodulation unit 865 and the tuner unit 860. As a result, the printed circuit 861 is effectively used without a dead space for mounting a connector, and the above-mentioned connectors of this embodiment reduces the production cost of the radio frequency apparatus.

Ninth Embodiment

Figure 12A:
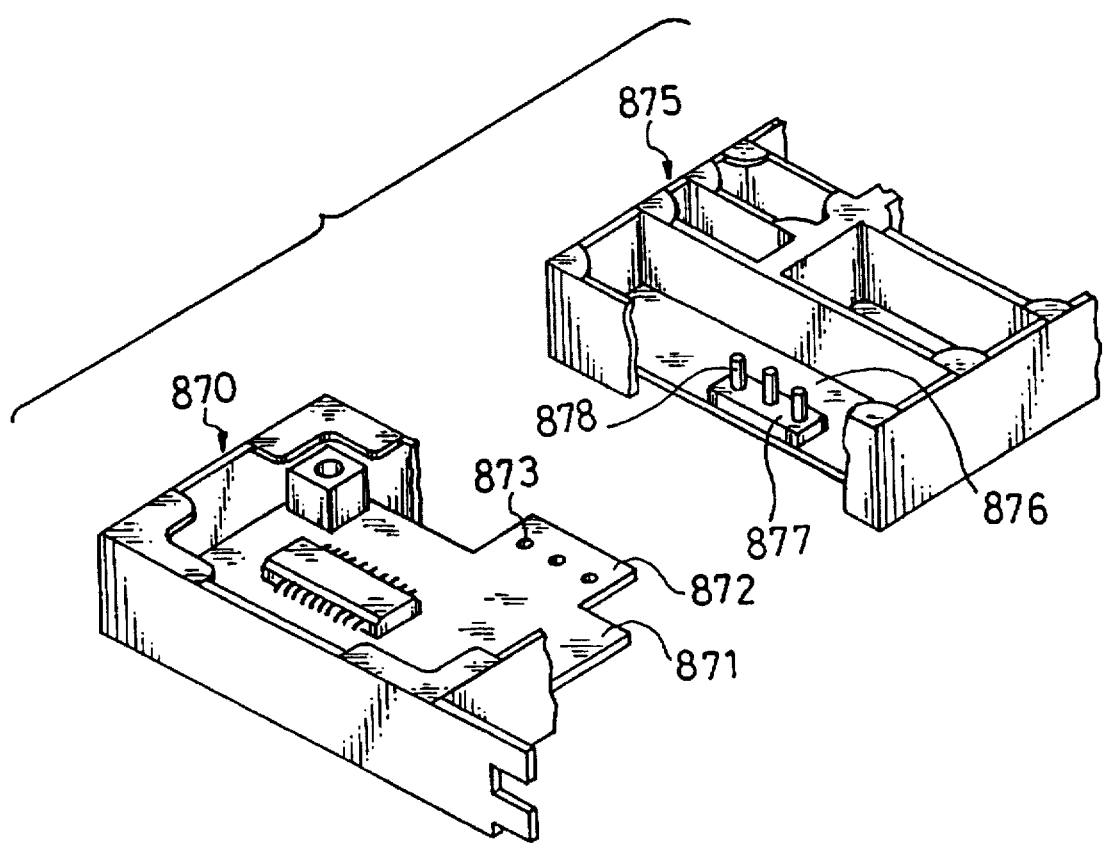
FIG. 12A is a perspective view showing a part of a radio frequency apparatus of a ninth embodiment in accordance with the present invention.
Figure 12B:
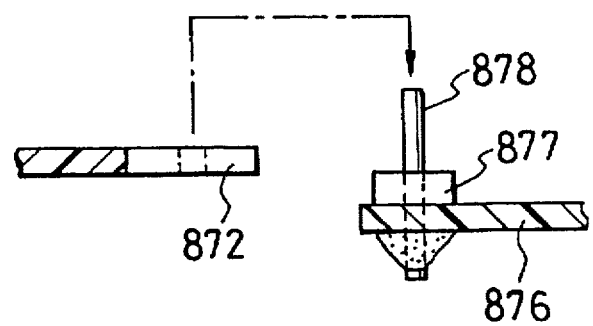
FIG. 12B is a sectional side view showing a part of the radio frequency apparatus of FIG. 12A.

FIG. 12A is a perspective view showing a part of a demodulation unit 870 and a tuner unit 875 in a ninth embodiment of a radio frequency apparatus in accordance with the present invention. FIG. 12B is a sectional view showing a part of connectors of the radio frequency apparatus of FIG. 12A.

As shown in FIG. 12A, a printed substrate 871 of the demodulation unit 870 has an extended portion 872 which is formed to project in a facing direction to the tuner unit 875. Plural holes 873 are formed in the extended portion 872. On the other hand, the tuner unit 875 has a printed substrate 876 on which a pin-type male terminal 877 is mounted to be connected with the extended portion 872 of the printed substrate 871 of the demodulation unit 870. When the demodulation unit 870 is electrically connected to the tuner unit 875, plural pins 878 of the pin-type male terminal 877 of the tuner unit 875 are inserted into the holes 873 of the printed substrate 871 of the demodulation unit 870, and the pins 1878 and the holes 873 are soldered as shown in FIG. 12B.

In this embodiment, since the extended portion 872 is integrally formed with the printed substrate 871, the demodulation unit 870 and the tuner unit 875 are easily and accurately coupled electrically by a connecting device having a simple construction.

Figure 13A:
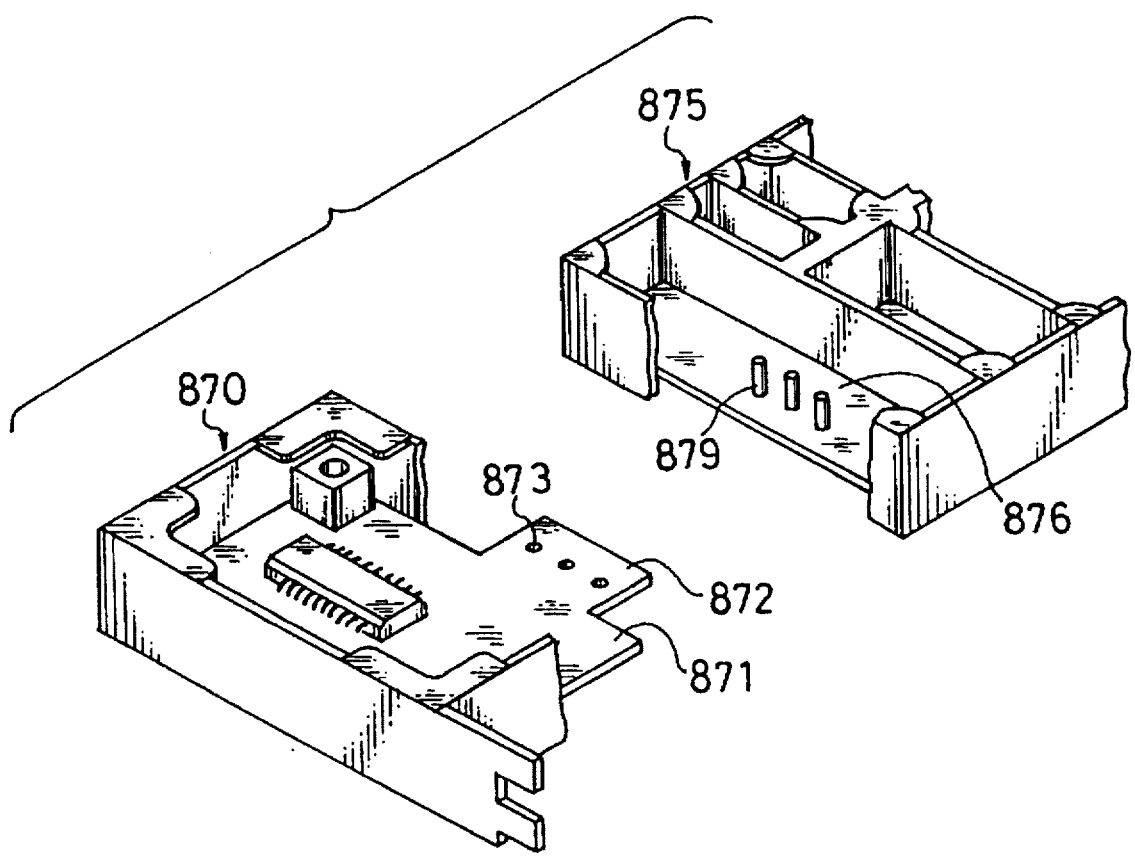
FIG. 13A is a perspective view showing a part of a radio frequency apparatus in accordance with the present invention.
Figure 13B:
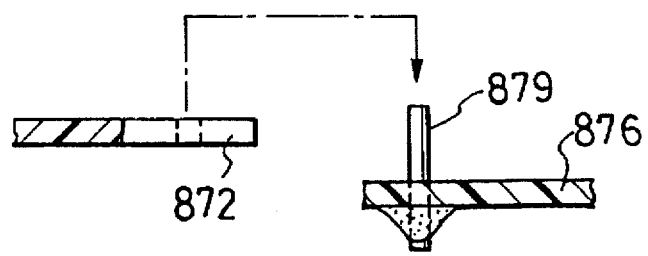
FIG. 13B is a sectional side view showing a part of the radio frequency apparatus of FIG. 13A.

FIG. 13A is a perspective view showing a part of a demodulation unit 870 and a tuner unit 875 in a radio frequency apparatus of another modified embodiment in accordance with the present invention. FIG. 13B is a sectional view showing a part of connectors of the radio frequency apparatus of FIG. 13A. Apart from the above-mentioned embodiment wherein the pin-type male terminal 877 comprises plural pins 878 and a base plate fixed on the printed substrate 876, a modified embodiment may be such that a pin-type male terminal is constituted by only plural pins 879 directly fixed to a printed substrate 876 as shown in FIGS. 13A and 13B.

Tenth Embodiment

Figure 14A:
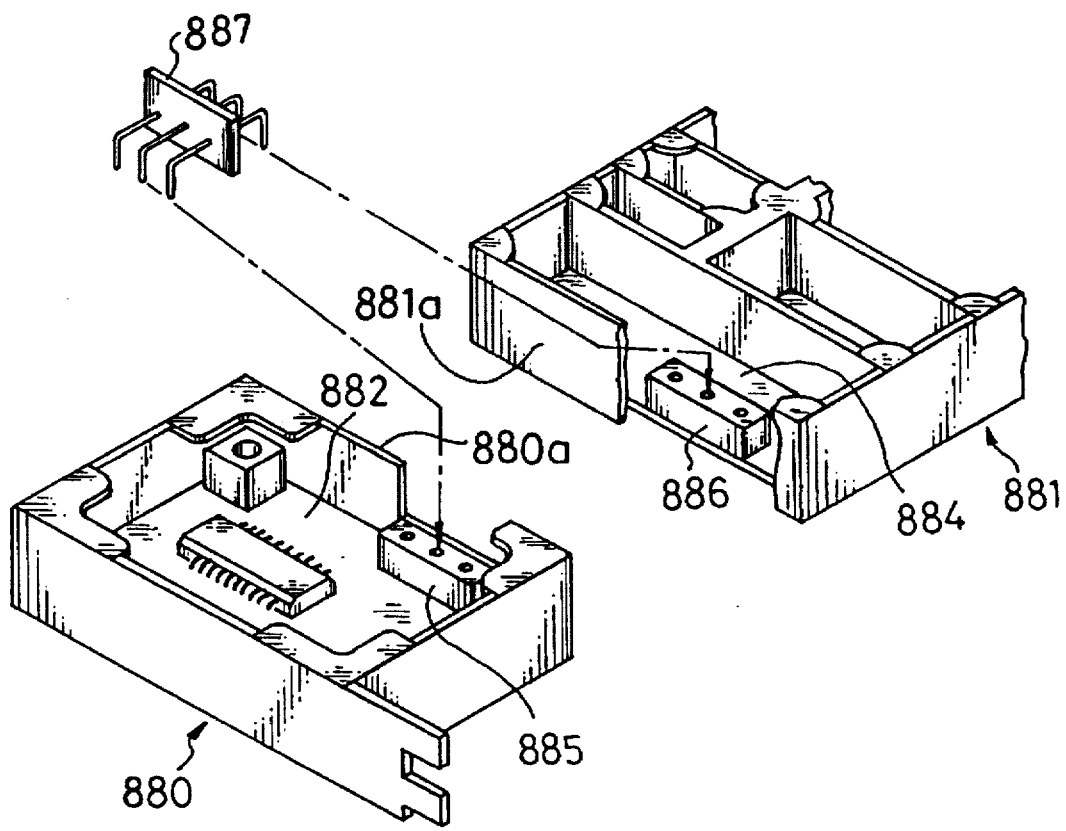
FIG. 14A is a perspective view showing a part of a radio frequency apparatus of a tenth embodiment in accordance with the present invention.
Figure 14B:
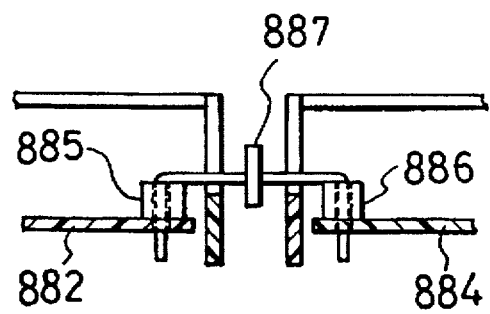
FIG. 14B is a sectional side view showing a part of the radio frequency apparatus of FIG. 14A.

FIG. 14A is a perspective view showing a part of a demodulation unit 880 and a tuner unit 881 of a radio frequency apparatus of a tenth embodiment in accordance with the present invention. FIG. 14B is a sectional view showing a part of connectors in the radio frequency apparatus of FIG. 14A.

As shown in FIG. 14A, two pin-type female terminals 885 and 886 are mounted on a printed substrate 882 and 884 of the demodulation unit 880 and the tuner unit 881, respectively. And, the pin-type female terminals 885, 886, which are arranged to face on the printed substrates 882, 884, are electrically connected by a connector 887 having plural U-shaped bent pins as shown in FIG. 14B. The radio frequency-apparatus of this embodiment dispenses with plural projected pins on a facing wall for connecting between the demodulation unit 880 and the tuner unit 881. Therefore, it is advantageous in handling and mounting of the demodulation unit 880 and the tuner unit 881, especially independently mounting each unit because of no projecting portion.

Figure 14C:
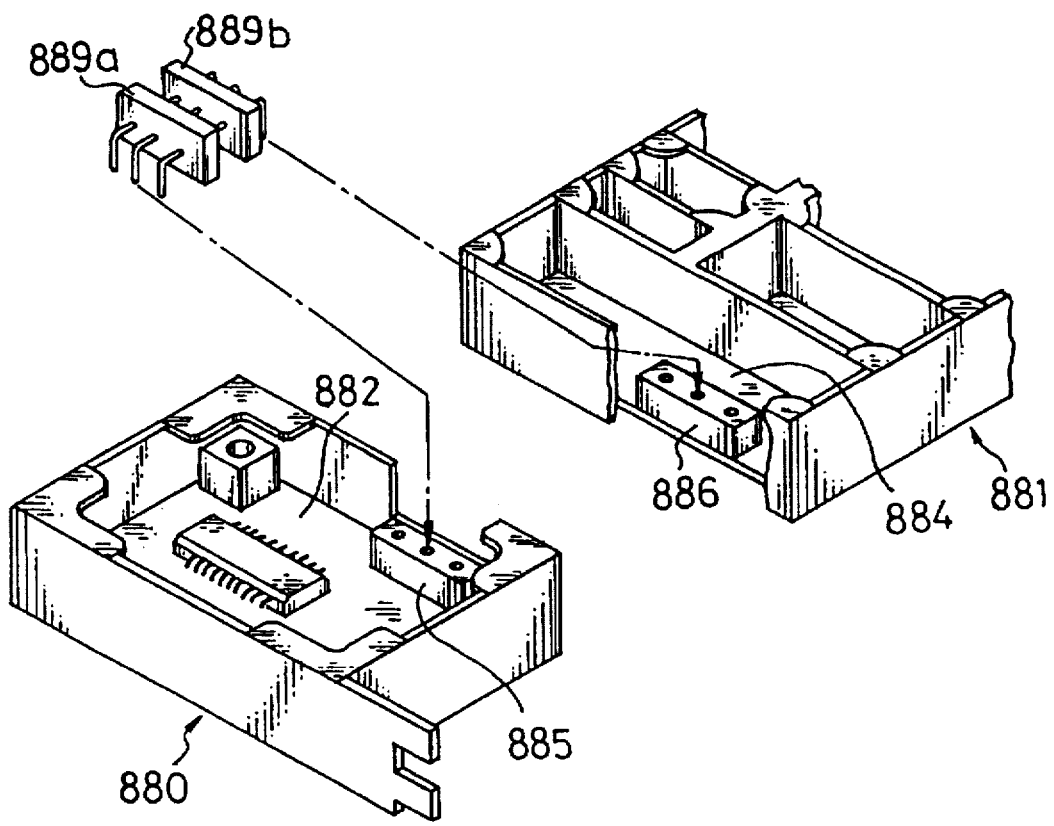
FIG. 14C is a perspective view showing a part of a radio frequency apparatus in accordance with the present invention.
Figure 14D:
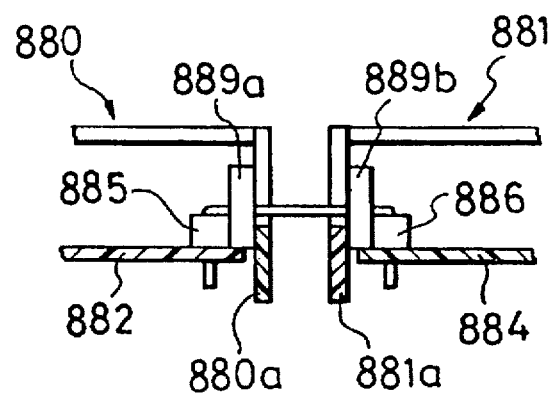
FIG. 14D is a sectional side view showing a part of the radio frequency apparatus of FIG. 14C.

Apart from the above-mentioned embodiment wherein two pin-type female connectors 885, 886 of the demodulation unit 880 and the tuner unit 881 are electrically connected by the connector 887, a modified embodiment may be such that two pin-type female connectors 885, 886 are electrically and mechanically connected by a connector 889 having two connecting plates 889a and 889b shown in FIGS. 14C and 14D. FIG. 14C is a perspective view showing a part of the demodulation unit 880 and the tuner unit 881. FIG. 14D is a sectional view showing a part of the connector 889 which connects between the demodulation unit 880 and the tuner unit 881. The connecting plate 889a of the connector 889 is disposed in a space to be sandwiched between the pin-type female connector 885 and a facing wall 880a of the demodulation unit 880, and the other connecting plate 889b is disposed in a space to be sandwiched between the pin-type female connector 886 and a facing wall 881a of the tuner unit 881 as shown in FIG. 14D.

Eleventh Embodiment

Figure 15A:
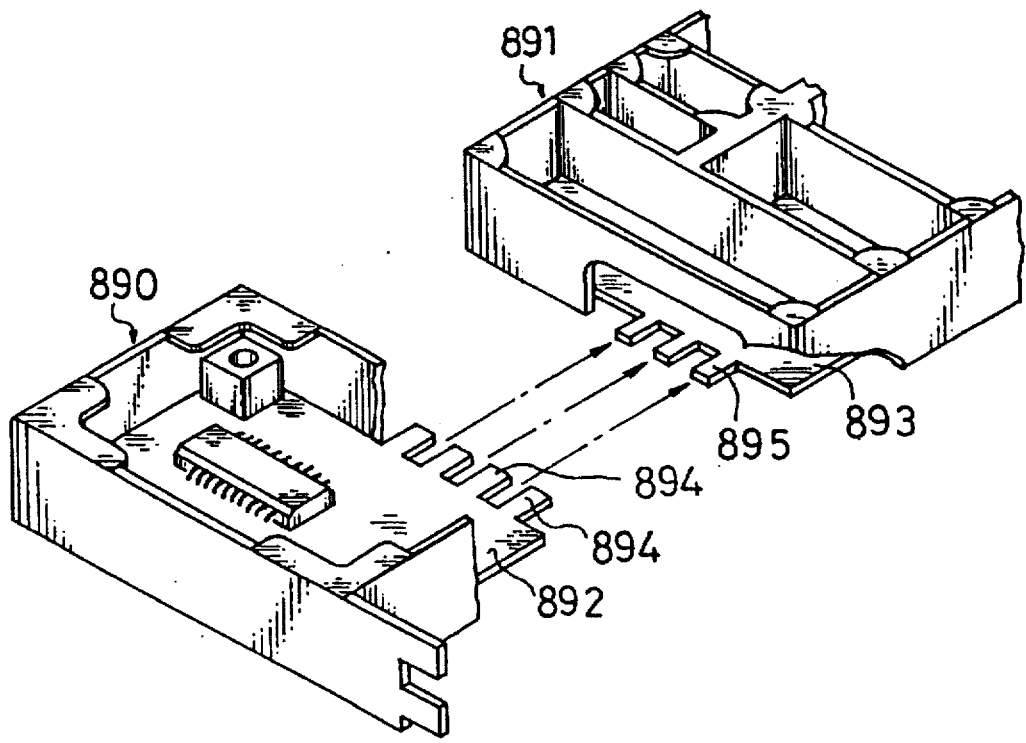
FIG. 15A is a perspective view showing a part of a radio frequency apparatus of a eleventh embodiment in accordance with the present invention.
Figure 15B:
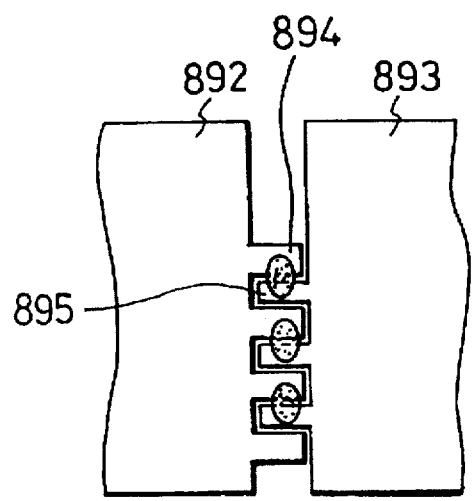
FIG. 15B is a plan view showing a part of the radio frequency apparatus of FIG. 15A.
Figure 15C:
FIG. 15C is a sectional side view showing a part of the radio frequency apparatus of FIG. 15A.

FIG. 15A is a perspective view showing a part of a demodulation unit 890 and a tuner unit 891 of an eleventh embodiment of a radio frequency apparatus in accordance with the present invention. FIG. 15B is a plan view showing a part of connecting device of the radio frequency apparatus. FIG. 15C is a sectional view showing a part of the connecting device of FIG. 15B.

As shown in FIG. 15A, a printed substrate 892 of the demodulation unit 890 has plural projections 894 which are formed in a comb-shape to project toward a facing direction to the tuner unit 891. And a printed substrate 893 of the tuner unit 891 has plural projections 895 which are formed to be arranged between the projections 894 of the demodulation unit 890 as shown in FIG. 15B. Though these printed substrates 892, 893 have printed patterns thereon, the printed patterns are omitted in FIGS. 15A, 15B and 15C. These printed substrates 892 and 893 are electrically connected by soldering as shown in FIGS. 15B and 15C. As a result, the above-mentioned connecting device of the eleventh embodiment reduces the production cost of the radio frequency apparatus.

Twelfth Embodiment

Figure 16A:
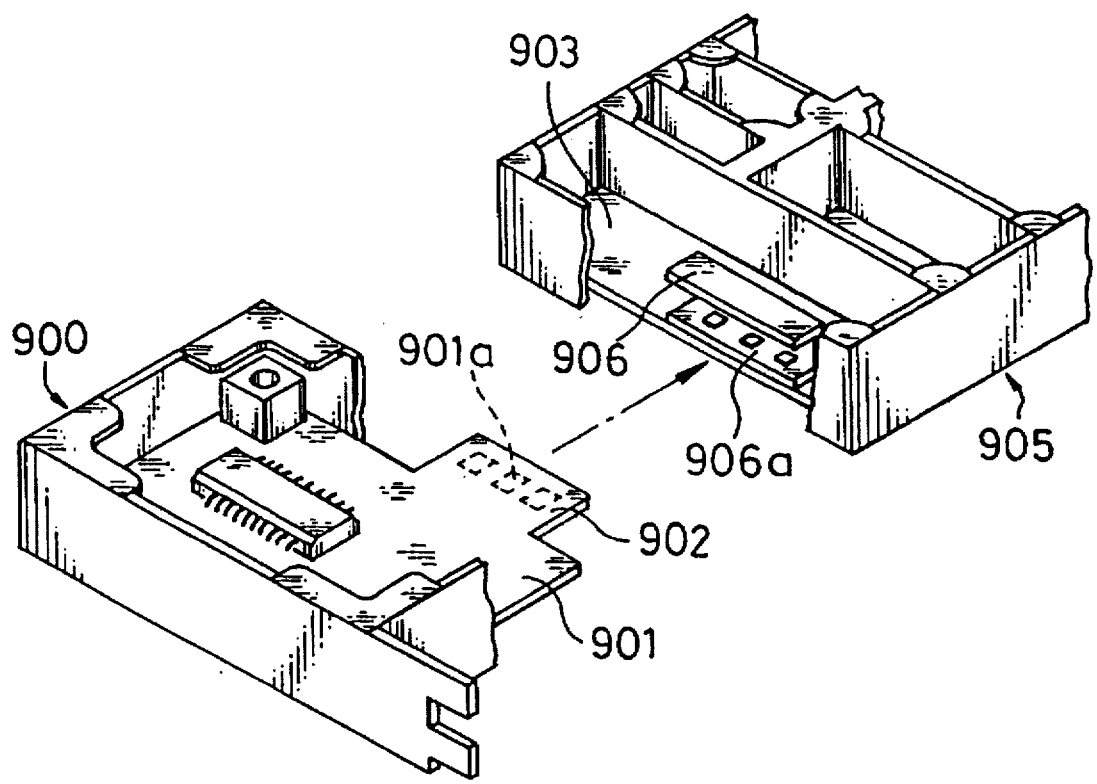
FIG. 16A is a perspective view showing a part of a radio frequency apparatus of a twelfth embodiment in accordance with the present invention.
Figure 16B:
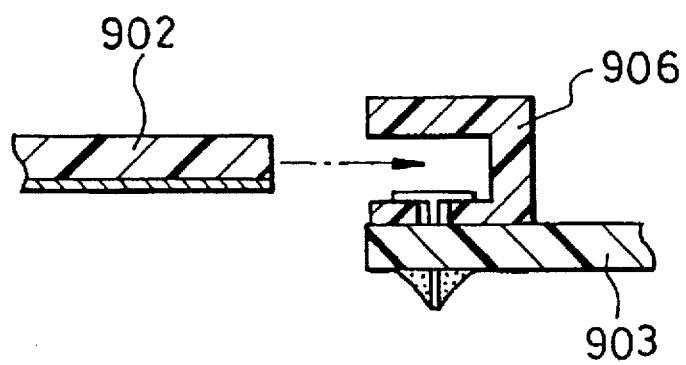
FIG. 16B is a sectional side view showing a part of the radio frequency apparatus of FIG. 16A.

FIG. 16A is a perspective view showing a part of a demodulation unit 900 and a tuner unit 905 of a twelfth embodiment of a radio frequency apparatus in accordance with the present invention. FIG. 16B is a sectional view showing a part of connecting device between the demodulation unit 900 and the tuner unit 905.

As shown in FIG. 16A, a printed substrate 901 of the demodulation unit 900 has an extended portion 902 having plural electrode terminals 901a on a rear face. On the other hand, the tuner unit 905 has a U-shaped connector 906 having plural electrode terminals 906a on a printed substrate 903. The U-shaped connector 906 is arranged to catch the extended portion 902 of the printed substrate 901 as shown in FIG. 16B. Though these printed substrates 901, 903 have printed patterns thereon, the printed patterns are omitted in FIGS. 16A, 16B. When the extended portion 902 is caught by the U-shaped connector 906, the tuner unit 905 is electrically connected with the demodulation unit 900. In this embodiment, a card-edge-connector is realized by the above-mentioned connecting device of the printed substrate.

Thirteenth Embodiment

Figure 17A:
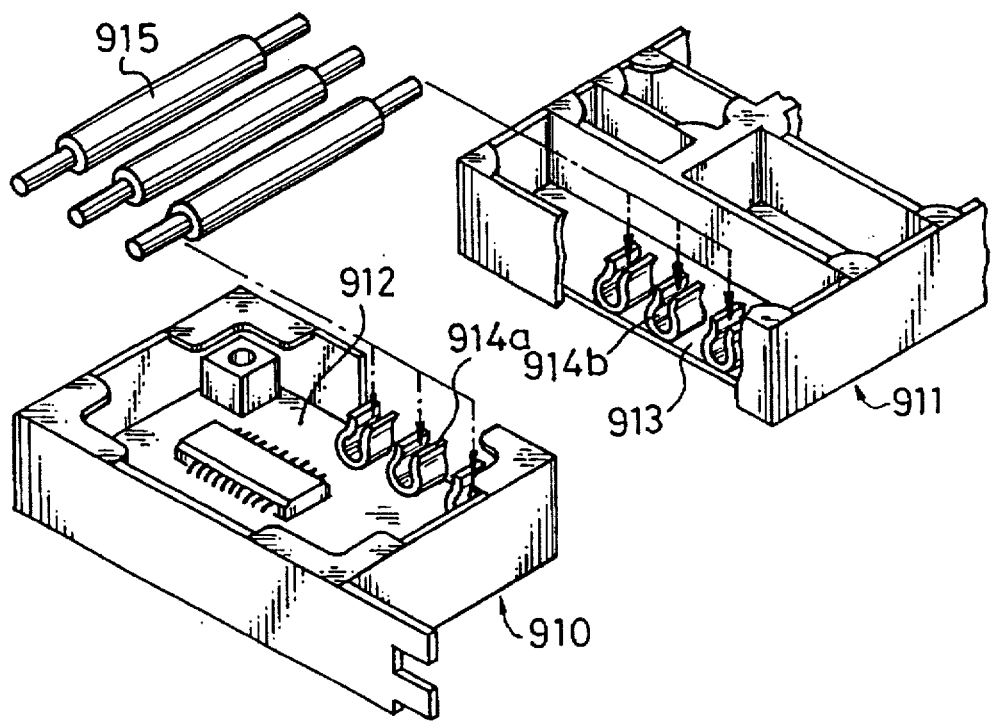
FIG. 17A is a perspective view showing a part of a radio frequency apparatus of a thirteenth embodiment in accordance with the present invention.
Figure 17B:
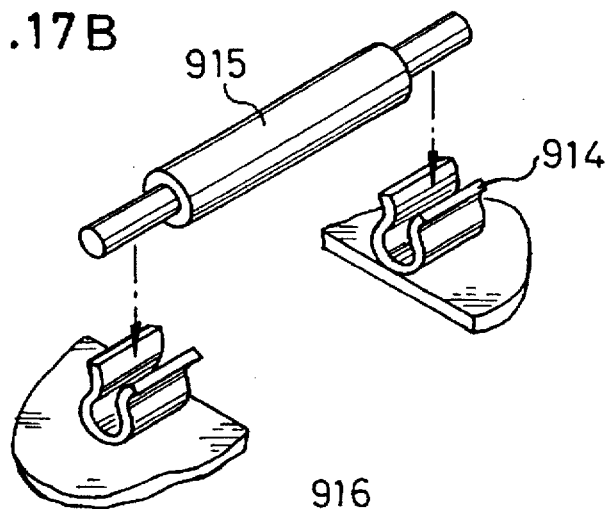
FIG. 17B is a perspective view showing a part of the radio frequency apparatus of FIG. 17A.

FIG. 17A is a perspective view showing a part of a demodulation unit 910 and a tuner unit 911 of a thirteenth embodiment of a radio frequency apparatus in accordance with the present invention. FIG. 17B is a perspective view showing a part of connecting device which connects between the demodulation unit 910 and the tuner unit 911.

As shown in FIG. 17A, plural clips 914a for fastening connecting wires 915 are mounted on a printed substrate 912 of the demodulation unit 910. On the other hand, the tuner unit 911 has a printed substrate 913 on which plural clips 914b are mounted to be electrically connected to the clips 914a of the demodulation unit 910 via the connecting wires 915. Though these printed substrates 912, 913 have printed patterns thereon, the printed patterns are omitted in FIGS. 17A and 17B.

Figure 17C:
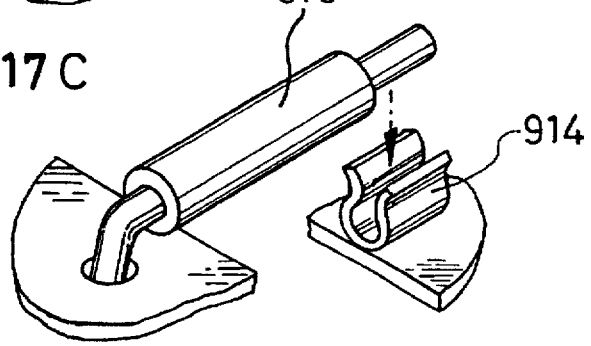
FIG. 17C is a perspective view showing a part of a radio frequency apparatus in accordance with the present invention.

Apart from the above-mentioned embodiment wherein the clips 914a and 914b on both sides of the demodulation unit 910 and the tuner unit 911 are connected by a connecting wire 915 as shown in FIG. 17B, a modified embodiment may be such that an end of a connecting wire 916 is directly connected to a printed substrate, and the other end of the connecting wire 916 is caught by a clip 914 as shown in FIG. 17C. FIG. 17C is a perspective view showing a part of the connecting device having the connecting wire 916.

Fourteenth Embodiment

Figure 18A:
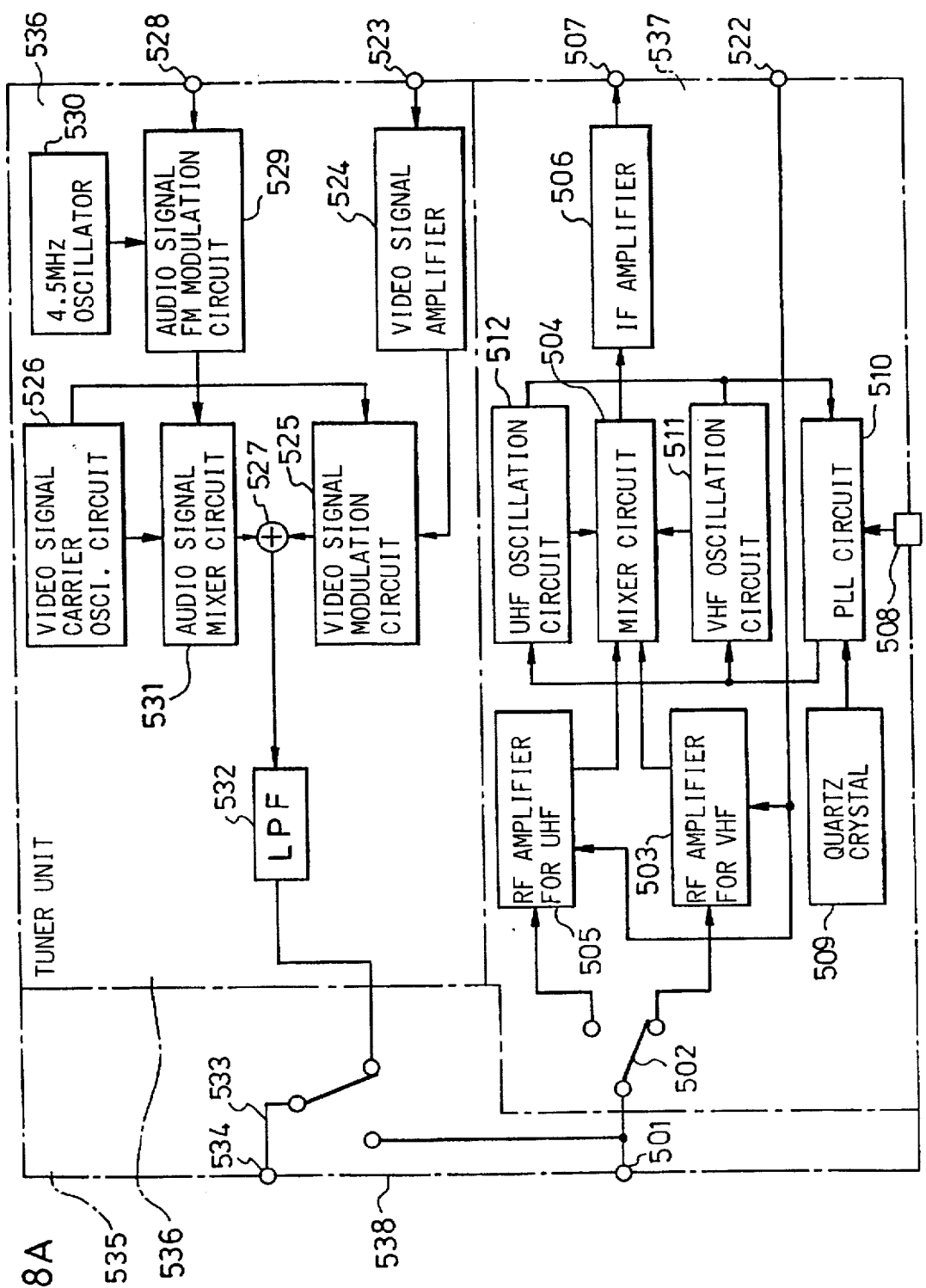
FIG. 18A is a block diagram of a radio frequency apparatus of a fourteenth embodiment in accordance with the present invention.
Figure 18B:
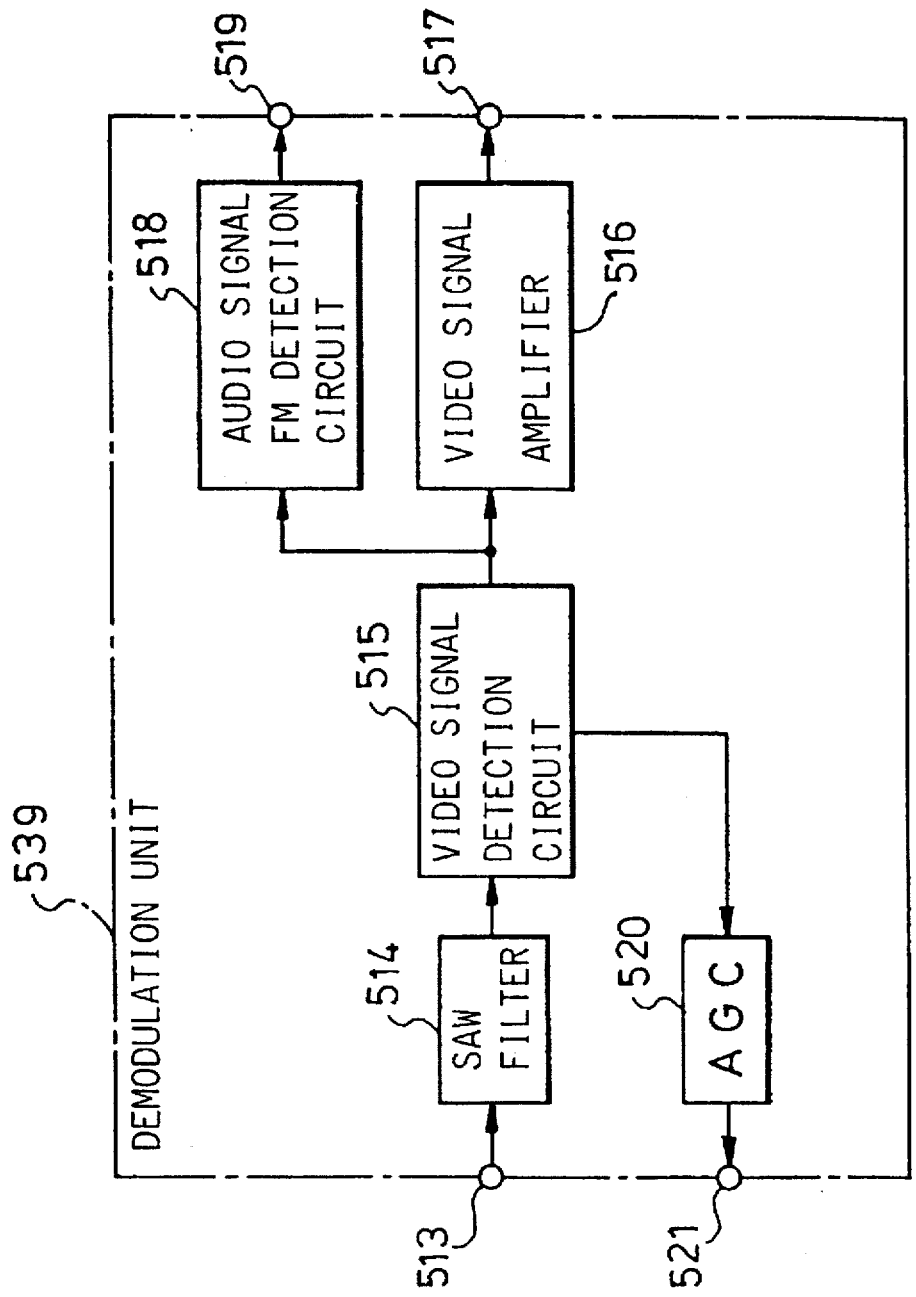
FIG. 18B is a block diagram of the ratio frequency apparatus of the fourteenth embodiment.
Figure 19:
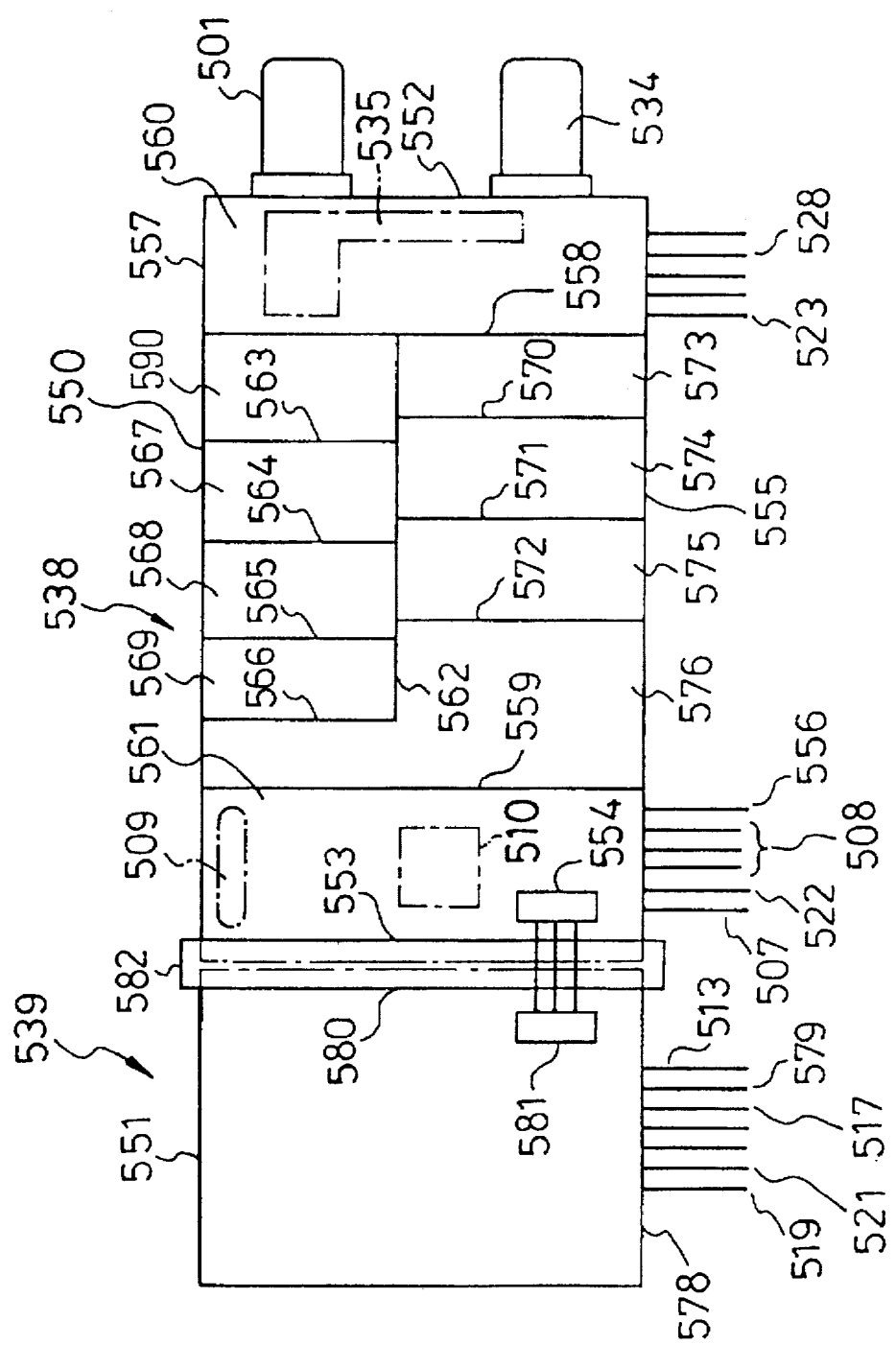
FIG. 19 is a schematic plan view of the radio frequency apparatus of the fourteenth embodiment.

Hereafter, a fourteenth embodiment of a radio frequency apparatus in accordance with the present invention is elucidated with reference to the accompanying drawings of FIGS. 18A, 18B and 19. FIGS. 18A and 18B are block diagrams of the radio frequency apparatus for a television receiver or VCR (Video Cassette Recorder). FIG. 19 is a schematic plan view showing the radio frequency apparatus of FIGS. 18A and 18B. In FIG. 18A, a RF (radio frequency) input terminal 501 is connected to a common terminal of a selector switch 502 for UHF (Ultra High Frequency)/VHF (Very High Frequency). One terminal of the selector switch 502 is connected to a RF amplifier 503 for VHF, and the other terminal of the selector switch 502 is connected to a RF amplifier 505 for UHF. Each output signal of the RF amplifier 503 and the RF amplifier 505 is applied to the mixer circuit 504. And, an output signal of the mixer circuit 504 is applied to an IF (intermediate frequency) amplifier 506. An output signal of the IF amplifier 506 is produced from an IF (intermediated frequency) output terminal 507.

A data input terminal 508 is connected to a PLL (phase-locked loop) circuit 510 which receives a signal of a quartz crystal 509. An output signal of the PLL circuit 510 is applied to a VHF oscillation circuit 511. And the output signal of the VHF oscillation circuit 511 is applied to the mixer circuit 504 and the PLL circuit 510. Similarly, the output signal of the PLL circuit 510 is applied to a UHF oscillation circuit 512, and the output signal of the UHF oscillation circuit 512 is applied to the mixer circuit 504 and the PLL circuit 510.

In the demodulation unit 539 shown in FIG. 18B, an IF (intermediate frequency) input terminal 513 to be connected to the IF output terminal 507 of the tuner unit 538 is connected to a SAW filter (Surface Acoustic Wave filter) 514. A video signal detection circuit 515, which receives an output signal of the SAW filter 514, feeds a video signal to a video signal amplifier 516 and an audio signal FM detection circuit 518. And, the output signals of the video signal detection circuit 515 and the video signal amplifier 516 are produced from a video signal output terminal 517 and an audio signal output terminal 519. And further, an output signal for AGC (Automatic Gain Control) from the video signal detection circuit 515 is applied to an AGC circuit 520, and an AGC output signal is produced from an AGC output terminal 521. The video signal detection circuit 515, the video signal amplifier 516, the audio signal FM detection circuit 518 and the AGC circuit 520, are integrated in only one IC. Since the AGC output terminal 521 is connected to an AGC input terminal 522 of the tuner unit 538, the AGC signal of the AGC output terminal 521 is applied to the above-mentioned both RF amplifiers 503 and 505 via the AGC input terminal 522 of the tuner unit 538.

In the tuner unit 538 shown in FIG. 18A, a video signal input terminal 523 is connected to a video signal amplifier 524. The output signal of the video signal amplifier 524 is applied to a video signal modulation circuit 525. The video signal modulation circuit 525 receives an output signal of a video signal carrier oscillation circuit 526, and the video signal modulation circuit 525 feeds an output signal to an adder 527.

On the other hand, an audio signal input terminal 528 is connected to an audio signal FM modulation circuit 529. And the audio signal FM modulation circuit 529 receives an output signal of an 4.5 MHz oscillator 530. The output signal of the audio signal FM modulation circuit 529 is applied to an audio signal mixer circuit 531. The audio signal mixer circuit 531, which receives the output signal from the video signal carrier oscillation circuit 526, feeds an output signal to the adder 527 for mixing the audio signal and video signal. The output signal of the adder 527 is applied to an LPF (Low Pass Filter) 532 which is connected to a terminal of an antenna selector switch 533. The other terminal of the antenna selector switch 533 is connected to a common terminal of the UHF/VHF selector switch 502. The common terminal of the antenna selector switch 533 is connected to a radio frequency signal output terminal 534.

In this embodiment, an antenna circuit 535 comprises the radio frequency signal input terminal 501, the radio frequency signal output terminal 534 and the antenna selector switch 533. A RF (radio frequency) converter circuit 536 comprises the video signal input terminal 523, the video signal amplifier 524, the LPF 532 and so on. A tuner circuit 537 comprises the selector switch 502 for UHF/VHF, the RF amplifiers 503, 505, the mixer circuit 504, the IF amplifier 506 and so on. The tuner unit 538 is constituted by the antenna circuit 535, the RF converter circuit 536 and the tuner circuit 537 as shown in FIG. 18A.

As shown in FIG. 18B, the demodulation unit 539 comprises the SAW filter 514, the video signal detection circuit 515, the video signal amplifier 516, the audio signal FM detection circuit 518 and AGC circuit 520 etc.

Next, the arrangement of the above-mentioned circuits of a radio frequency apparatus for a television receiver (TV) or a video cassette receiver (VCR) is elucidated with further reference of FIG. 19. FIG. 19 is a schematic plan view showing a radio frequency apparatus for TV or VCR. In FIG. 19, the tuner unit 538 is disposed in a tuner unit housing 550, and the demodulation unit 539 is disposed in a demodulation unit housing 551, separately.

The RF input terminal 501 and the RF output terminal 534 of the tuner unit 538 are provided on a front wall 552 of the tuner unit housing 550 to a facing wall 553. The tuner connector 554, which is electrically connected to the above-mentioned IF output terminal 507 and the AGC input terminal 522, is provided on the facing wall 553. A flank wall 555 of the tuner unit housing 550 has the video signal input terminal 523, the audio signal input terminal 528, the power source terminal 556, the data input terminals 508 for tuning, the IF output terminal 507 and the AGC input terminal 522.

As shown in FIG. 19, the inner space of the tuner unit housing 550 is divided by two separating plates 558 and 559 which are disposed between both of the flank walls 555 and 557 of the tuner unit housing 550. The antenna circuit 535 is disposed in a first room 560 which is arranged between the separating plate 558 and the front wall 552. The PLL circuit 510, the quartz crystal 509 and the tuner connector 554 etc. are disposed in a second room 561 which is arranged between the separating plate 559 and the facing wall 553. As shown in FIG. 19, the quartz crystal 509 is arranged near the flank wall 557, and the tuner connector 554 is arranged near the other flank wall 555 having plural terminals. The data input terminals 508, the IF output terminal 507 and the AGC input terminal 522 etc. are provided on the flank wall 555 near the second room 561. Therefore, a short and simple conductive interconnection pattern of a printed board can be used in this embodiment as aforementioned first embodiment.

A separating plate 562 is arranged in parallel to these flank walls 555 and 557, and disposed between the separating plates 558 and 559 as shown in FIG. 19. And, an inner space between the separating plate 562 and the flank wall 557 is divided by four separating plates 563, 564, 565 and 566. Four rooms 566, 567, 568, 590, which are formed by the separating plates 563, 564, 565, 566, receive the circuits for UHF, that is, the RF amplifier 505 and the UHF oscillation circuit 512.

On the other hand, an inner space between the separating plate 562 and the flank wall 555 is divided by three separating plates 570, 571 and 572. Four rooms 573, 574, 575 and 576, which are formed by separating plates 570, 571, 572, receive most of the circuits for VHF, that is, the RF amplifier 503 and the VHF oscillation circuit 511 etc.

In the demodulation unit 539, the IF input terminal 513, the video signal output terminals 517, the audio signal output terminal 519, the AGC input terminal 521, and the power source terminal 579 etc. are provided on a flank wall 578 as shown in FIG. 19. The demodulation connector 581 to be connected to the tuner connector 554 of the tuner unit 538 is provided near the facing wall 580 which is arranged to be connected with the facing wall 553 of the tuner unit housing 550 via the connecting device 582.

In this embodiment, the facing wall 580 is provided to be easily fixed or removed by the connecting device which are disclosed in the aforementioned embodiments.

Fifteenth Embodiment

Figure 20:
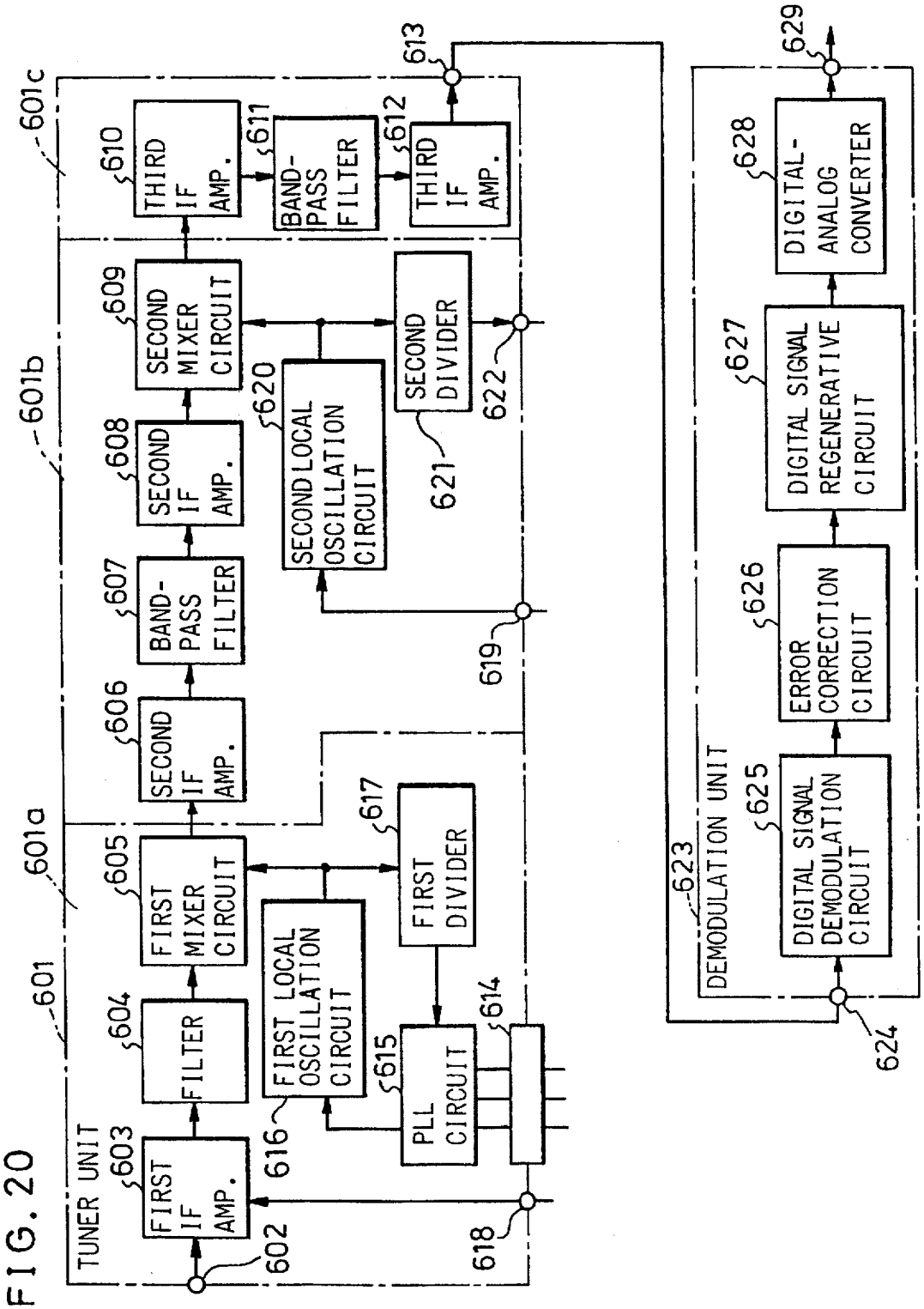
FIG. 20 is a block diagram of a radio frequency apparatus of a fifteenth embodiment in accordance with the present invention.

Hereafter, a fifteenth embodiment of a radio frequency apparatus in accordance with the present invention is elucidated with reference to the accompanying drawings of FIG. 20. FIG. 20 is a block diagram of the radio frequency apparatus having a double-conversion system for receiving satellite broadcasting service. In FIG. 20, a tuner unit 601 is constituted by three sections.

A first section 601a comprises a first IF amplifier 603 which is connected to the RF input terminal 602, a filter 604 which is connected to the first IF amplifier 603, and a first mixer circuit 605 which receives an output signal of the filter 604.

And further, the first section 601a has a data input terminal 614 for enable clock data, a PLL circuit 615 which is connected to the data input terminal 614, a first local oscillation circuit 616 which receives an output signal of the PLL circuit 615. The output signal of the first local oscillation circuit 616 is applied to the first mixer circuit 605, and applied to the PLL circuit 615 via a first divider circuit 617. An AGC input terminal 618 of the tuner unit 601 is connected to the first IF amplifier 603.

A second section 601b of the tuner unit 601 comprises a second IF amplifier 606 which receives an output signal of the first mixer circuit 605, a first band-pass filter 607, a second IF amplifier 608 which receives an output signal of the first band-pass filter 607, and a second mixer circuit 609 of which one input terminal is connected to the second IF amplifier 608.

And further, the second section 601b of the tuner unit 601 comprises a second local oscillation circuit 620 which receives an output signal of an external PLL circuit (not shown) via an input terminal 619, a second divider circuit 621 which receives an output signal from the second local oscillation circuit 620, and a divided signal output terminal 622. And, the output signal of the second local oscillation circuit 620 is also applied to the input terminal of the second mixer circuit 609.

A third section 601c of tuner unit 601 comprises a third IF amplifier 610 which receives an output signal of the second mixer circuit 609, a band-pass filter 611, and a third IF amplifier 612 for amplifying an output signal of the band-pass filter. And the IF output signal of the third IF amplifier 612 outputs from an IF output terminal 613 of the demodulation unit 623.

On the other hand, the demodulation unit 623 comprises a digital signal demodulation circuit 625 which receives an IF signal of the tuner unit 601 via IF input terminal 624, an error correction circuit 626 which is connected to the digital signal demodulation circuit 625, a digital signal regenerative circuit 627, and a digital-analog converter 628 which feeds an output signal to an analog signal output terminal 629.

The tuner unit housing of the tuner unit 601 and the demodulation unit housing of the demodulation unit 623 are provided to be easily attached or removed by the connecting device which is disclosed in the aforementioned embodiments.

Sixteenth Embodiment

Figure 21:
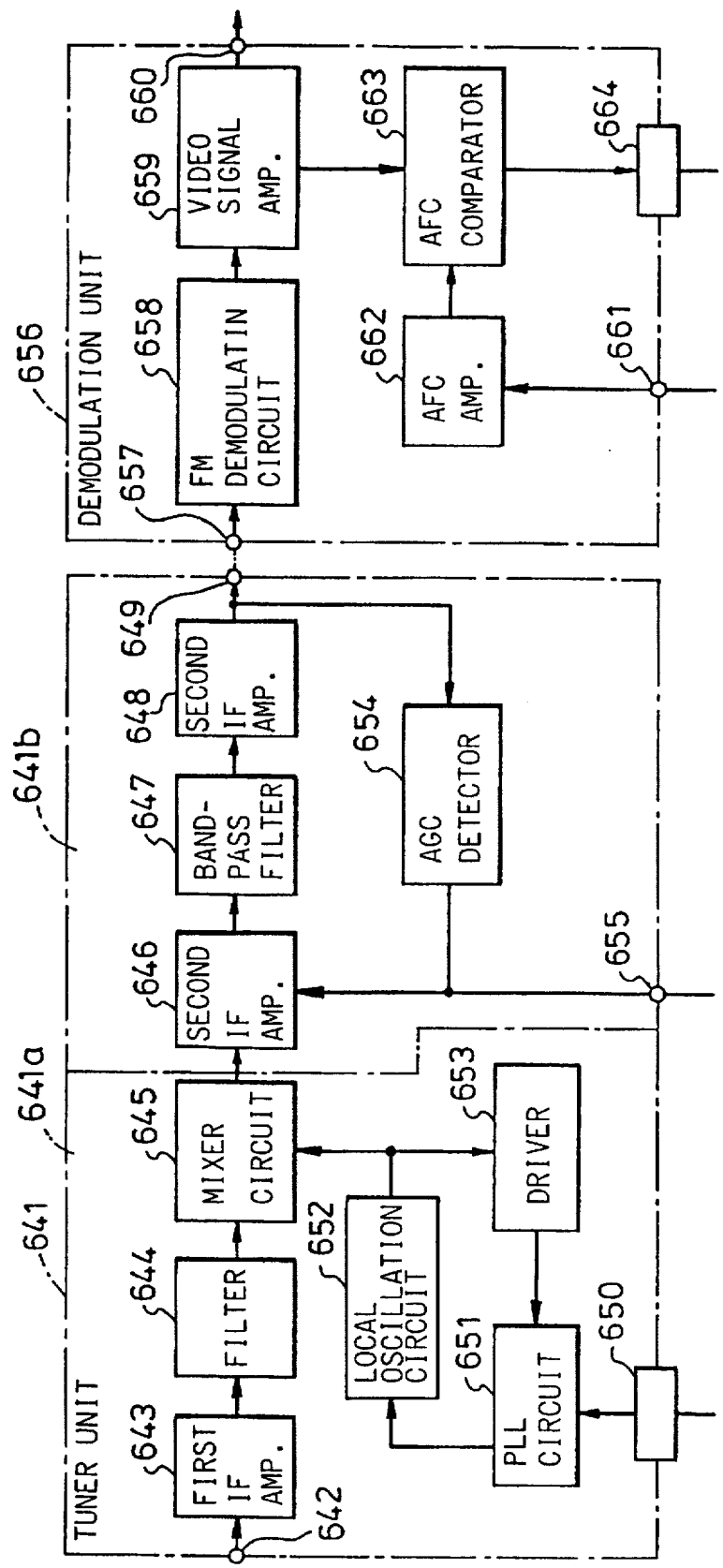
FIG. 21 is a block diagram of a radio frequency apparatus of a sixteenth embodiment in accordance with the present invention.

Hereafter, a sixteenth embodiment of a radio frequency apparatus in accordance with the present invention is elucidated with reference to the accompanying drawings of FIG. 21. FIG. 21 is a block diagram of the radio frequency apparatus for receiving satellite broadcasting service.

In FIG. 21, a tuner unit 641 is constituted by two sections. A first section 641a comprises a first IF amplifier 643 which receives RF signal from a RF input terminal 642, a filter 644 which receives an output signal of the first IF amplifier 643, a mixer circuit 645 of which one input terminal is connected to the filter 644, and the other input terminal is connected to a local oscillation circuit 652.

And the first section 641a of the tuner unit 641 further comprises a PLL circuit 651 which is connected to a data input terminal 650, and a divider 653 which receives the output signal of the local oscillation circuit 652, and feeds an output signal to the PLL circuit 651.

A second section 641b of the tuner unit 641 comprises a second IF amplifier 646 which receives an output signal of the mixer circuit 645, a band-pass filter 647, a second IF amplifier 648 for amplifying an output signal of the band-pass filter 647, and an AGC detector 654. The output signal of the second IF amplifier 648 is produced from an output terminal 649, and applied to the AGC detector 654. And the output signal of the AGC detector 654 is applied to the second IF amplifier 646 as well as an AGC signal of an AGC signal input terminal 655 as shown in FIG. 21.

On the other hand, the demodulation unit 656 comprises an FM demodulation circuit 658 which receives the output signal of the tuner unit 641 via an input terminal 657, a video signal amplifier 659 which receives an output signal of the FM demodulation circuit 658. The output signal of the video signal amplifier 659 is produced from a demodulation output terminal 660. And the output signal of the video signal amplifier 659 is also applied to an AFC comparator 663 which compares the output signal of the video signal amplifier 659 and an output signal of an AFC amplifier 662. The AFC amplifier 662 is provided to amplify a signal of an AFC input terminal 661. The output signal of the AFC comparator 663 is applied to an AFC output terminal 664.

The tuner unit housing of the tuner unit 641 and the demodulation unit housing the demodulation unit 656 are provided to be easily attached or removed by the connecting device which is disclosed in the aforementioned embodiments.

Seventeenth Embodiment

Figure 22A:
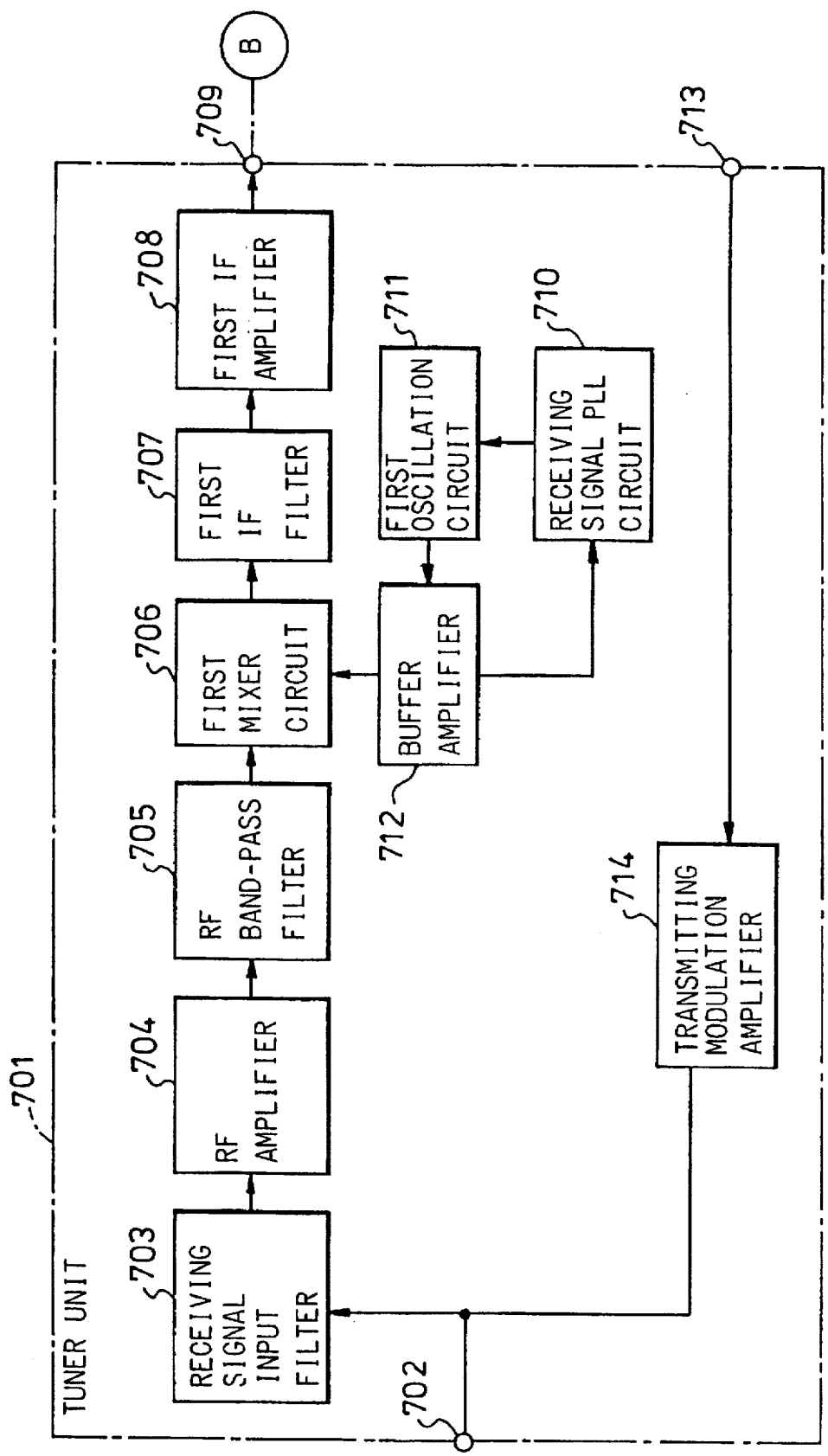
FIG. 22A is a block diagram of a radio frequency apparatus of a seventeenth embodiment in accordance with the present invention.
Figure 22B:
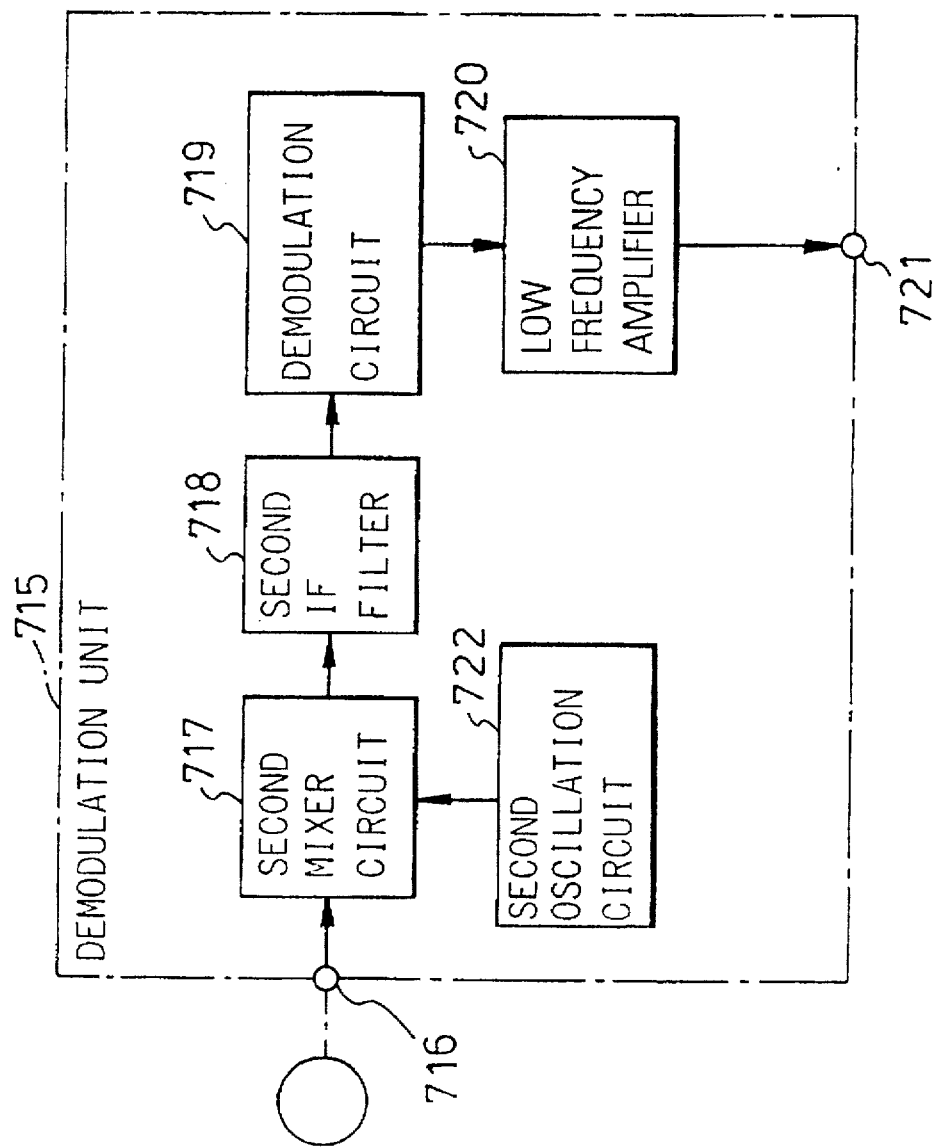
FIG. 22B is a block diagram of the ratio frequency apparatus of the seventeenth embodiment.

Hereafter, a seventeenth embodiment of a radio frequency apparatus in accordance with the present invention is elucidated with reference to the accompanying drawings of FIG. 22A and 22B. FIG. 22A is a block diagram of a tuner unit 701 of the radio frequency apparatus for a locomotive communication apparatus. FIG. 22B is a block diagram of a demodulation unit 715 of the radio frequency apparatus of FIG. 22A.

In FIG. 22A, the tuner unit 701 comprises a receiving signal input filter 703 which is connected to a RF input terminal 702, a RF amplifier 704 which receives an output signal of the receiving signal input filter 703, a RF band-pass filter 705 which receives an output signal of the RF amplifier 704, and a first mixer circuit 706 of which one input terminal is connected to the RF band-pass filter 705, and the other input terminal is connected to a buffer amplifier 712. The output signal of the first mixer circuit 706 is applied to a first IF amplifier 708 via an IF filter 707. And an output signal of the first IF amplifier 708 is produced from an IF output terminal 709. In the tuner unit 701, the buffer amplifier 712 receives an output signal of a first oscillation circuit 711 and outputs a signal to a receiving signal PLL circuit 710. An output signal of the receiving signal PLL circuit 710 is applied to the first oscillation circuit 711.

As shown in FIG. 22A, the tuner unit 701 has a modulation signal input terminal 713 which is connected to a transmitting modulation amplifier 714. The output signal of the transmitting modulation amplifier 714 is applied to the receiving signal input filter 703 via a terminal which is electrically connected to the RF input terminal 702.

As shown in FIG. 22B, the demodulation unit 715 shown in FIG. 22B comprises a second mixer circuit 717 which receives an IF signal from the IF output terminal 709 via an IF input terminal 716, a second IF filter 718 which is connected to the second mixer circuit 717, a demodulation circuit 719 which receives the output signal of the second IF filter 718, and a low frequency amplifier 720. The output signal of the low frequency amplifier 720 is produced from a demodulation output terminal 721. And, the second mixer circuit 717 is connected to a second oscillation circuit 722 to receive the output signal of the second oscillation circuit 722.

The tuner unit housing of the tuner unit 701 and the demodulation unit housing of the demodulation unit 715 are provided to be easily attached or removed by the connecting device disclosed in the aforementioned embodiments.

Eighteenth Embodiment

Hereafter, an eighteenth embodiment of a radio frequency apparatus in accordance with the present invention is elucidated with reference to the accompanying drawings. Especially, an arrangement of terminals in a tuner connector and a demodulation connector of the radio frequency apparatus is disclosed with reference to the drawings of FIGS. 23A, 23B and 23C.

Figure 23A:
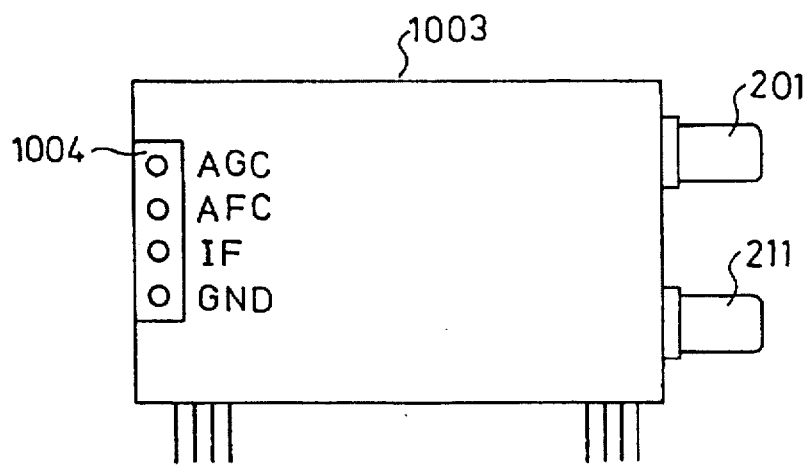
FIG. 23A is a schematic plan view of a modulation unit of a radio frequency apparatus of an eighteenth embodiment in accordance with the present invention.
Figure 23B:
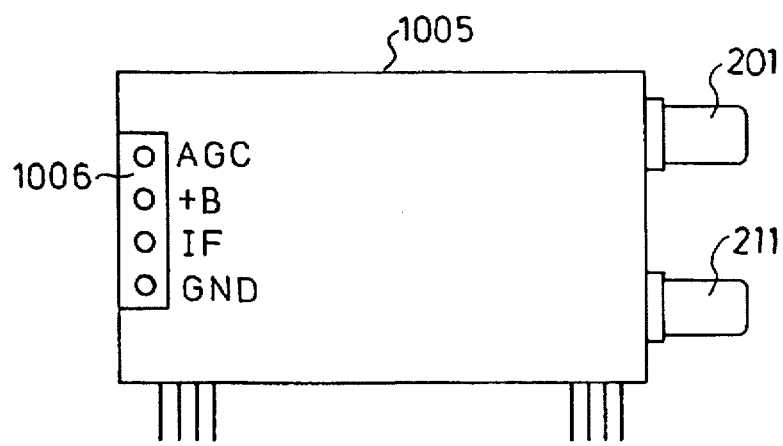
FIG. 23B is a schematic plan view of a tuner unit of the radio frequency apparatus of the eighteenth embodiment.
Figure 23C:
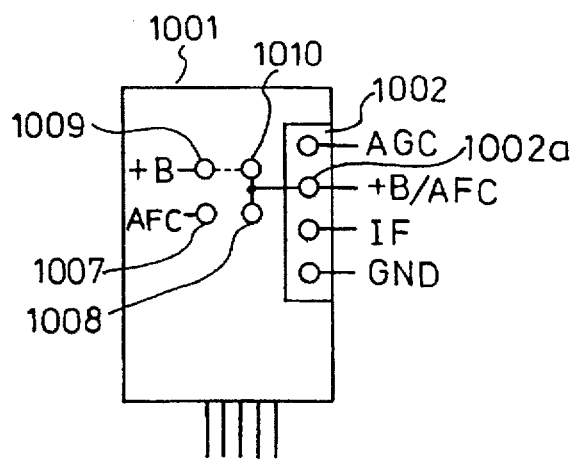
FIG. 23C is a schematic plan view of a tuner unit of the radio frequency apparatus of the eighteenth embodiment.

FIG. 23A is a schematic plan view of a frequency synthesizer type tuner unit 1003, FIG. 23B is a schematic plan view of a voltage synthesizer type tuner unit 1005, and FIG. 23C is a schematic plan view of a demodulation unit 1001.

In the frequency synthesizer type tuner unit 1003 shown in FIG. 23A, a tuner connector 1004 having four terminals is arranged on a facing wall of the frequency synthesizer type tuner unit 1003 to be coupled with the demodulation unit 1001. These terminals of the tuner connector 1004 are arranged to be connected to an AGC (Automatic Gain Control) terminal, an AFC (Automatic Frequency Control) terminal, an IF (Intermediate Frequency) and a GND (Grounded) terminal in order from upside of FIG. 23A.

In the voltage synthesizer type tuner unit 1005 shown in FIG. 23B, a tuner connector 1006 having four terminals is arranged on a facing wall of the voltage synthesizer type tuner unit 1005 to be coupled with the demodulation unit 1001. These terminals of the tuner connector 1006 are arranged to be connected to an AGC terminal, a plus power source terminal, an IF terminal, and a GND terminal in order from upside of FIG. 23B.

In the demodulation unit 1001 shown in FIG. 23C, a demodulation connector 1002 having four terminals is arranged on a facing wall of the demodulation unit 1001 to be connected with the connector 1004 or 1006. These terminals of the demodulation connector 1002 are arranged to be connected to an AGC terminal, a plus power source terminal, or an AFC terminal, an IF terminal, and a GND terminal in order from up side of FIG. 23C.

Therefore, the second terminal 1002a of the demodulation connector 1002 of the demodulation unit 1001 functions as an AFC terminal when the frequency synthesizer type tuner unit 1003 is connected to the demodulation unit 1001. On the other hand, when the voltage synthesizer type tuner unit 1005 is connected to the demodulation unit 1001, the second terminal 1002a of the demodulation connector 1002 functions as a power source terminal.

In the demodulation unit 1001, when the second terminal 1002a of the demodulation connector 1002 outputs an AFC signal, that is, when the frequency synthesizer type tuner unit 1003 is connected to the demodulation unit 1001, two terminals 1007 and 1008 of printed patterns on a printed substrate in the demodulation unit 1001 are electrically connected by a jumper cable having substantially 0 ohm resistance or a resistor line having substantially 0 ohm resistance. On the other hand, when the second terminal 1002a of the connector 1002 outputs a power source signal, that is, when the voltage synthesizer type tuner unit 1005 is connected to the demodulation unit 1001, two terminals 1009 and 1010 of printed patterns on the printed substrate are electrically connected by a 0 ohm jumper cable or a 0 ohm resistor line.

As mentioned above, the second terminal 1002a of the connector 1002 of the demodulation unit 1001 outputs selectively an AFC signal or a power source signal. As a result, the demodulation unit 1001 can be connected to both of the tuner units 1003 and 1005 without change of the amount or arrangement of the terminals in the demodulation connector 1002 and the tuner connectors 1004, 1006.

Nineteenth Embodiment

Figures 24A, 24B:
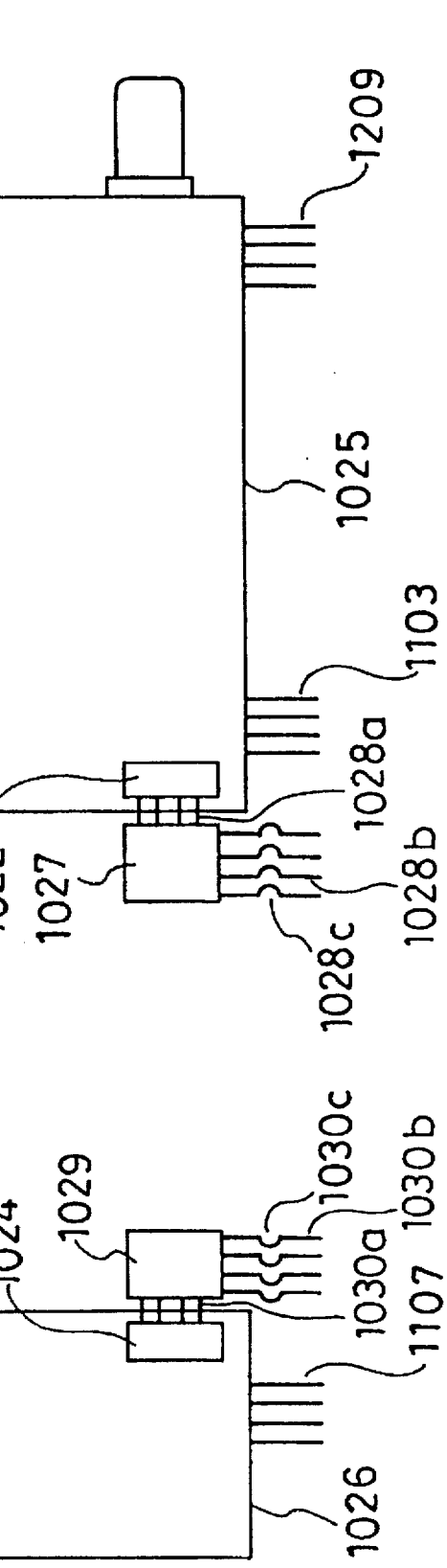
FIG. 24A is a schematic plan view of a tuner unit of a radio frequency apparatus of a nineteenth embodiment in accordance with the present invention.
FIG. 24B is a schematic plan view of a demodulation unit of the radio frequency apparatus of the nineteenth embodiment.

Hereafter, a nineteenth embodiment of a radio frequency apparatus in accordance with the present invention is elucidated with reference to the accompanying drawings of FIGS. 24A and 24B. FIG. 24A is a schematic plan view showing the tuner unit 1021 of the radio frequency apparatus. FIG. 24B is a schematic plan view showing the demodulation unit 1023 of the radio frequency apparatus. In this embodiment, a tuner unit 1021 and a demodulation unit 1023 are independently provided in a radio frequency apparatus.

As shown in FIG. 24A, a tuner connector 1022 is arranged in a tuner unit housing adjacent to a facing wall 1109 of the tuner unit 1021. The tuner connector 1022 is connected to an L-type connector 1027 having first terminals 1028a and second terminals 1028b which are projected in two directions. The tuner connector 1022 is inserted by the first terminals 1028a of the L-type connector 1027. And, the second terminals 1028b are arranged to project in the same direction as power source terminals 1103 and video signal input terminals 1209 etc. which are provided on a flank wall 1025. As mentioned above, since the second terminals 1028b of the tuner connector 1022 are arranged to project from a face of the flank wall 1025, the tuner unit 1021 does not need to have terminals on the flank wall 1025, which are electrically connected to the tuner connector 1022 in the tuner unit housing. As a result, the tuner unit 1021 can be independently mounted on a printed substrate from the demodulation unit in the radio frequency apparatus 1023.

As shown in FIG. 24A, the first terminals 1028b of the L-type connector 1027 have bent portions 1028c, respectively. The bent portions 1028c function as stopper when the tuner unit 1021 is mounted on the printed substrate. Therefore, the tuner unit 1021 can be easily connected to a connector of the printed substrate.

In the demodulation unit 1023 shown in FIG. 24B, a demodulation connector 1024 is arranged in a demodulation unit housing adjacent to a facing wall 1110 to the tuner unit 1021. The demodulation connector 1024 is connected to an L-type connector 1029 having first terminals 1030a and second terminals 1030b which are projected in two directions. The demodulation connector 1024 is inserted by the first terminals 1030a of the L-type connector 1029. And, the second terminals 1030b are arranged to project in the same direction as power source terminals 1107 etc. which are provided on a flank wall 1026. As mentioned above, since the second terminals 1030b of the L-type connector 1029 are arranged to project from a face of the flank wall 1026, the demodulation unit 1023 does not need to have terminals on the flank wall 1026, which are electrically connected to the demodulation connector 1024 in the demodulation unit housing. As a result, the demodulation unit 1023 can be mounted independently on a printed substrate from the tuner unit 1021.

As shown in FIG. 24B, the second terminals 1030b of the L-type connector 1029 have bent portions 1030c, respectively. Since the bent portions 1030c function as stopper, the demodulation unit 1023 can be easily mounted on the printed substrate.

According to the present invention, the tuner unit and the demodulation unit of the radio frequency apparatus are easily attached or removed by the connecting device provided on each housing of the tuner unit and the demodulation unit. Accordingly, many kinds of the radio frequency apparatus are constructed by combination of a few kind of the tuner units and the demodulation units.

And further, the tuner unit and the demodulation unit, which are surely kept in a connection state therebetween, are easily managed as a radio frequency apparatus of one unit. And, the management for the radio frequency apparatus is easily conducted on an adjusting and packing processes in a manufacturing, and an assembling process in an assembly plant.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A radio frequency apparatus comprising:
    a tuner unit which includes
        a tuner unit metal housing which has a connection portion,
        a tuner input terminal for receiving a radio frequency signal,
        a mixer circuit which is connected for receiving a radio frequency signal of said tuner input terminal,
        an oscillation circuit which outputs a signal having a designated frequency based on a receiving channel to said mixer circuit, and
        a tuner output terminal for outputting an intermediate frequency signal of said mixer circuit,
        wherein said mixer circuit and said oscillation circuit are disposed in said tuner unit metal housing, and said tuner unit is selected from a plurality of such tuner units which are of different kinds but which have a common design for said connection portion,
    a demodulation unit which includes
        a demodulation unit metal housing which has a connection portion,
        a demodulation input terminal for receiving said intermediate frequency signal of said tuner output terminal,
        a demodulation circuit which is connected to receive an intermediate frequency signal of said demodulation input terminal, and which is disposed in said demodulation unit metal housing, and
        a demodulation output terminal for outputting a signal of said demodulation circuit,
        wherein said demodulation unit is selected from a plurality of such demodulation units which are of different kinds but which have a common design for said connection portion, and
    connecting means connecting an outside wall of said tuner unit metal housing to an outside wall of said demodulation unit metal housing by attaching said connection portion of said tuner unit metal housing to said connection portion of said demodulation unit metal housing, whereby said tuner unit metal housing and said demodulation unit metal housing are connected together to form a unitary body.

2. A radio frequency apparatus in accordance with claim 1 wherein,
    said connecting means have connecting plates which are attached to both outside walls of said tuner unit metal housing or said demodulation unit metal housing so as to mechanically connect between said tuner unit and said demodulation unit.

3. A radio frequency apparatus in accordance with claim 1 wherein,
    said connecting means have extended portions which are formed on both sides of said tuner unit metal housing or said demodulation unit metal housing so as to mechanically connect said tuner unit metal housing to said demodulation unit metal housing.

4. A radio frequency apparatus in accordance with claim 1 wherein,
    said connecting means have at least one bendable tongue-shape portion which is formed on a facing wall of said tuner unit housing or said demodulation unit housing so as to mechanically connect between both facing walls of said tuner unit and said demodulation unit.

5. A radio frequency apparatus in accordance with claim 1 wherein,
    said connecting means have extended portions which are formed on both flank walls of said tuner unit metal housing or said demodulation unit metal housing, and said extended portions have holes for connecting to projections formed on both flank walls of said demodulation unit metal housing or said tuner unit metal housing.

6. A radio frequency apparatus comprising:
    a tuner unit which includes a tuner unit metal housing which has a connection portion, a tuner input terminal for receiving a radio frequency signal, a mixer circuit which is connected for receiving a radio frequency signal of said tuner input terminal, an oscillation circuit which outputs a signal having a designated frequency based on a receiving channel to said mixer circuit, and a tuner output terminal for outputting an intermediate frequency signal of said mixer circuit, wherein said mixer circuit and said oscillation circuit are disposed in said tuner unit metal housing, and said tuner unit is selected from a plurality of such tuner units which are of different kinds but which have a common design for said connection portion, a demodulation unit which includes a demodulation unit metal housing which has a connection portion, a demodulation input terminal for receiving said intermediate frequency signal of said tuner output terminal, a demodulation circuit which is connected to receive an intermediate frequency signal of said demodulation input terminal, and which is disposed in said demodulation unit metal housing, and a demodulation output terminal for outputting a signal of said demodulation circuit, wherein said demodulation unit is selected from a plurality of such demodulation units which are of different kinds but which have a common design for said connection portion, connecting means connecting an outside wall of said tuner unit metal housing to an outside wall of said demodulation unit metal housing by attaching said connection portion of said tuner unit metal housing to said connection portion of said demodulation unit metal housing, whereby said tuner unit metal housing and said demodulation unit metal housing are connected together to form a unitary body, and a connector which is arranged near facing walls of said tuner unit metal housing and said demodulation unit metal housing, and which is electrically connected between said tuner unit and said demodulation unit so as to apply said intermediate frequency signal to said demodulation circuit.

7. A radio frequency apparatus in accordance with claim 6 wherein, said connectors comprise a subsidiary substrate which is mounted on a printed substrate in either said tuner unit or said demodulation unit, and a pin-type connector which is mounted on a printed substrate in either said demodulation unit or said tuner unit so as to electrically connect to said subsidiary substrate.

8. A radio frequency apparatus in accordance with claim 6 wherein, said connectors comprise an extended portion which is provided on a printed substrate in said tuner unit or said demodulation unit, and which has at least one hole, a pin-type connector which is mounted on a printed substrate in said demodulation unit or said tuner unit so as to connect to said hole.

9. A radio frequency apparatus in accordance with claim 6 wherein, said connectors comprise pin-type female connectors which are mounted on both printed substrates of said tuner unit and said demodulation unit, and pin-type male connector which is connected between said pin-type female connectors.

10. A radio frequency apparatus in accordance with claim 6 wherein, said connectors comprise plural projections which are provided in both extended portions of printed substrates of said tuner unit and said demodulation unit, and which are formed in comb-shape to fit each other.

11. A radio frequency apparatus in accordance with claim 6 wherein, said connectors comprise an extended portion which is formed on a printed substrate in either said tuner unit or said demodulation unit, and which has at least one electrode terminal, and a U-shaped connector which is mounted on a printed substrate in either said demodulation unit or said tuner unit so as to catch said extended portion.

12. A radio frequency apparatus in accordance with claim 6 wherein, said connectors comprise plural clips which are mounted on a printed substrate in either said tuner unit or said demodulation unit, and at least one connecting wire for electrically connecting between said tuner unit and said demodulation unit.

13. A radio frequency apparatus in accordance with claim 6 wherein, said connectors comprise a coaxial cable.

14. A radio frequency apparatus in accordance with claim 6 wherein, said connectors comprise a photo coupler.

15. A radio frequency apparatus in accordance with claim 6 wherein, said connector is arranged on facing walls adjacent to flank wall having power source terminal for said tuner unit or said demodulation unit.

16. A radio frequency apparatus comprising:

a tuner unit which includes a tuner unit housing which has a connection portion, a tuner input terminal for receiving a radio frequency signal, a mixer circuit which is connected for receiving a radio frequency signal of said tuner input terminal, an oscillation circuit which outputs a signal having a designated frequency based on a receiving channel to said mixer circuit, and a tuner output terminal for outputting an intermediate frequency signal of said mixer circuit, wherein said mixer circuit and said oscillation circuit are disposed in said tuner unit housing, and said tuner unit is selected from a plurality of such tuner units which are of different kinds but which have a common design for said connection portion, a demodulation unit which includes a demodulation unit housing which has a connection portion, a demodulation input terminal for receiving said intermediate frequency signal of said tuner output terminal, a demodulation circuit which is connected to receive an intermediate frequency signal of said demodulation input terminal, and a demodulation output terminal for outputting a signal of said demodulation circuit, wherein said demodulation unit is selected from a plurality of such demodulation units which are of different kinds but which have a common design for said connection portion, and connecting means connecting an outside wall of said tuner unit housing to an outside wall of said demodulation unit housing by attaching said connection portion of said tuner unit housing to said connection portion of said demodulation unit housing, whereby said tuner unit housing and demodulation unit housing are connected together to form a unitary body, and a subsidiary substrate which is arranged to electrically connect between said tuner output terminal and said demodulation input terminal.

17. A radio frequency apparatus comprising:

a tuner unit which includes a tuner unit metal housing which has a connection portion, a tuner input terminal for receiving a radio frequency signal, a mixer circuit which is connected for receiving a radio frequency signal of said tuner input terminal, an oscillation circuit which outputs a signal having designated frequency based on a receiving channel to said mixer circuit, a PLL circuit which controls oscillation frequency of said oscillation circuit by receiving predetermined data based on said receiving channel, a data input terminal which is arranged on a flank wall of said tuner unit metal housing, and said flank wall has a power source terminal for operating said tuner unit, and a tuner output terminal for outputting an intermediated frequency signal of said mixer circuit;

wherein said mixer circuit and said oscillation circuit are disposed in said tuner unit metal housing, and said tuner unit is selected from a plurality of such tuner units which are of different kinds but which have a common design for said connection portion, a demodulation unit which includes a demodulation unit metal housing which has a connection portion, a demodulation input terminal for receiving said intermediate frequency signal of said tuner output terminal, a demodulation circuit which is connected for receiving an intermediate frequency signal of said demodulation input terminal, and which is disposed in said demodulation unit metal housing, and a demodulation output terminal for outputting a signal of said demodulation circuit, wherein said demodulation unit is selected from a plurality of such demodulation units which are of different kinds but which have a common design for said connection portion, connecting means connecting an outside wall of said tuner unit metal housing to an outside wall of said demodulation unit metal housing by attaching said connection portion of said tuner unit metal housing to said connection portion of said demodulation unit metal housing, whereby said tuner unit metal housing and said demodulation unit metal housing are connected together to form a unitary body, and a connector which electrically connects said tuner unit to said demodulation unit when said tuner unit metal housing is mechanically connected to said demodulation unit metal housing.

18. A radio frequency apparatus in accordance with claim 17 wherein, a quartz oscillator of said PLL circuit is arranged at a portion in the vicinity of a side wall adjacent to said power source terminal of said tuner unit, and a separating plate is disposed in said tuner unit to divide between said quartz oscillator and said connector.

19. A radio frequency apparatus in accordance with claim 17 wherein, said connector of tuner unit is arranged on a side wall adjacent to said power source terminal, a quartz oscillator of said PLL circuit is arranged at a portion in the vicinity of an opposite wall which is opposite to said side wall having said power source terminal.

20. A radio frequency apparatus in accordance with claim 17 wherein, a VHF (very high frequency) circuit is disposed in said tuner unit metal housing in the vicinity of a side wall of said tuner unit metal housing, said power source terminal is provided on said side wall, and a UHF (ultra high frequency) circuit is disposed in said tuner unit metal housing to be substantially parallel with an arrangement of said VHF circuit in said tuner unit.

21. A radio frequency apparatus in accordance with claim 20 wherein, said tuner unit further comprises an antenna circuit which is disposed in said tuner unit metal housing adjacent to said tuner input terminal.

22. A radio frequency apparatus in accordance with claim 20 wherein, said tuner unit further comprises a RF (radio frequency) converter which is disposed in said tuner unit metal housing in the vicinity of said tuner input terminal of said tuner unit.

23. A radio frequency apparatus comprising:

a tuner unit which includes a tuner unit metal housing which has a connection portion, a tuner input terminal for receiving a radio frequency signal, a mixer circuit which is connected for receiving a radio frequency signal of said tuner input terminal, an oscillation circuit which outputs a signal having a designated frequency based on a receiving channel to said mixer circuit, a tuner output terminal for outputting an intermediate frequency signal of said mixer circuit, and a tuner power source terminal which is provided on a side wall of said tuner unit housing, a tuner connecting terminal which is provided on said side wall having said tuner power source terminal, and wherein said mixer circuit and said oscillation circuit are disposed in said tuner unit metal housing, and said tuner unit is selected from a plurality of such tuner units which are of different kinds but which have a common design for said connection portion, a demodulation unit which includes a demodulation unit metal housing which has a connection portion, a demodulation input terminal for receiving said intermediate frequency signal of said tuner output terminal, a demodulation circuit which is connected for receiving an intermediate frequency signal of said demodulation input terminal, and which is disposed in said demodulation unit metal housing, and a demodulation output terminal for outputting a signal of said demodulation circuit, wherein said demodulation unit is selected from a plurality of such demodulation units which are of different kinds but which have a common design for said connection portion, connecting means connecting an outside wall of said tuner unit metal housing to an outside wall of said demodulation unit metal housing by attaching said connection portion of said tuner unit metal housing to said connection portion of said demodulation unit metal housing, whereby said tuner unit metal housing and said demodulation unit metal housing are connected together to form a unitary body, and a connector which electrically connects said tuner unit to said demodulation unit when said tuner unit is mechanically connected to said demodulation unit, and connector of said tuner unit is electrically connected to said tuner connecting terminal.

24. A radio frequency apparatus in accordance with claim 23 wherein, said connector of said tuner unit has a terminal for power source.

25. A radio frequency apparatus comprising:

a tuner unit which includes a tuner unit metal housing which has a connection portion, a tuner input terminal for receiving a radio frequency signal, a mixer circuit which is connected for receiving a radio frequency signal of said tuner input terminal, an oscillation circuit which outputs a signal having a designated frequency based on a receiving channel to said mixer circuit, and a tuner output terminal for outputting an intermediated frequency signal of said mixer circuit, wherein said mixer circuit and said oscillation circuit are disposed in said tuner unit metal housing, and said tuner unit is selected from a plurality of such tuner units which are of different kinds but which have a common design for said connection portion, a demodulation unit which includes a demodulation unit metal housing which has a connection portion, a demodulation input terminal for receiving said intermediate frequency signal of said tuner output terminal, a demodulation circuit which is connected for receiving an intermediate frequency signal of said demodulation input terminal, and which is disposed in said demodulation unit metal housing, a demodulation output terminal for outputting a signal of said demodulation circuit, a demodulation power source terminal which is provided on a side wall of said demodulation unit housing, and a demodulation connecting terminal which is provided on said side wall having said demodulation power source terminal, wherein said demodulation unit is selected from a plurality of such demodulation units which are of different kinds but which have a common design for said connection portion, connecting means connecting an outside wall of said tuner unit metal housing to an outside wall of said demodulation unit metal housing by attaching said connection portion of said tuner unit metal housing to said connection portion of said demodulation unit metal housing, whereby said tuner unit metal housing and said demodulation unit metal housing are connected together to form a unitary body, and a connector which electrically connects said tuner unit to said demodulation unit when said tuner unit is mechanically connected to said demodulation unit, and said connector of said demodulation unit is electrically connected to said demodulation connecting terminal.

26. A radio frequency apparatus in accordance with claim 25 wherein said connector of said demodulation unit has a terminal for power source.

27. A radio frequency apparatus comprising:

a tuner unit metal housing which has a connection portion, a tuner input terminal for receiving a radio frequency signal, a mixer circuit which is connected for receiving a radio frequency signal of said tuner input terminal, an oscillation circuit which outputs a signal having a designated frequency based on a receiving channel to said mixer circuit, and which is controlled by a predetermined control voltage based on a receiving channel, and a tuner output terminal for outputting an intermediate frequency signal of said mixer circuit, wherein said mixer circuit and said oscillation circuit are disposed in said tuner unit metal housing, and said tuner unit is selected from a plurality of such tuner units which are of different kinds but which have a common design for said connection portion, a demodulation unit which includes a demodulation unit metal housing which has a connection portion, a demodulation input terminal for receiving said intermediate frequency signal of said tuner output terminal, a demodulation circuit which is connected for receiving an intermediate frequency signal of said demodulation input terminal, and which is disposed in said demodulation unit metal housing, and a demodulation output terminal for outputting a signal of said demodulation circuit, wherein said demodulation unit is selected from a plurality of such demodulation units which are of different kinds but which have a common design for said connection portion, connecting means connecting an outside wall of said tuner unit metal housing to an outside wall of said demodulation unit metal housing by attaching said connection portion of said tuner unit metal housing to said connection portion of said demodulation unit metal housing, whereby said tuner unit metal housing and said demodulation unit metal housing are connected together to form a unitary body, and a connector which electrically connects between said tuner unit and said demodulation unit when said tuner unit is mechanically connected to said demodulation unit.

28. A radio frequency apparatus comprising:
a tuner unit which includes
  a tuner unit metal housing,
  a tuner input terminal for receiving a radio frequency signal,
  a mixer circuit which is connected for receiving a radio frequency signal of said tuner input terminal,
  an oscillation circuit which outputs a signal having a designated frequency based on a receiving channel to said mixer circuit, and
  a tuner output terminal for outputting an intermediate frequency signal of said mixer circuit,
  said mixer circuit and said oscillation circuit being disposed in said tuner unit metal housing,
a demodulation unit which includes
  a demodulation unit metal housing,
  a demodulation input terminal for receiving said intermediate frequency signal of said tuner output terminal,
  a demodulation circuit which is connected for receiving an intermediate frequency signal of said demodulation input terminal, and which is disposed in said demodulation unit metal housing, and
  a demodulation output terminal for outputting a signal of said demodulation circuit, and
connecting means for attaching said tuner unit metal housing and said demodulation unit metal housing at respective outside walls thereof,
a connector which electrically connects between said tuner unit and said demodulation unit when said tuner unit is mechanically connected to said demodulation unit, and
selection means which selectively feed a signal to said connector of said demodulation unit so as to meet said tuner unit having a frequency synthesizer type or a voltage synthesizer type.

29. A radio frequency apparatus comprising:
a tuner unit which includes
  a tuner unit metal housing which has a connection portion,
  a tuner input terminal for receiving a radio frequency signal,
  a mixer circuit which is connected for receiving a radio frequency signal of said tuner input terminal,
  an oscillation circuit which outputs a signal having a designated frequency based on a receiving channel to said mixer circuit, and
  a tuner output terminal for outputting an intermediate frequency signal of said mixer circuit,
  wherein said mixer circuit and said oscillation circuit are disposed in said tuner unit metal housing, and said tuner unit is selected from a plurality of such tuner units which are of different kinds but which have a common design for said connection portion,
a demodulation unit which includes
  a demodulation unit metal housing which has a connection portion,
  a demodulation input terminal for receiving said intermediate frequency signal of said tuner output terminal,
  a demodulation circuit which is connected for receiving an intermediate frequency signal of said demodulation input terminal, and which is disposed in said demodulation unit metal housing, and
  a demodulation output terminal for outputting a signal of said demodulation circuit,
  wherein said demodulation unit is selected from a plurality of such demodulation units which are of different kinds but which have a common design for said connection portion,
connecting means connecting an outside wall of said tuner unit metal housing to an outside wall of said demodulation unit metal housing by attaching said connection portion of said tuner unit metal housing to said connection portion of said demodulation unit metal housing, whereby said tuner unit metal housing and said demodulation unit metal housing are connected together to form a unitary body,
a connector which electrically connects between said tuner unit and said demodulation unit when said tuner unit is mechanically connected to said demodulation unit, and
at least one L-type connector which has at least two connecting pins arranged to project in two directions, and which is provided to be connected to said connector of said tuner unit or/and said demodulation unit.

* * * * *